(12) United States Patent
Xiao

(10) Patent No.: US 8,778,763 B2
(45) Date of Patent: Jul. 15, 2014

(54) METHOD FOR FORMING MEMORY CELL TRANSISTOR

(75) Inventor: Hong Xiao, Pleasanton, CA (US)

(73) Assignee: Hermes Microvision, Inc., Hsin-Chu (TW)

( * ) Notice: Subject to any disclaimer, the term of this patent is extended or adjusted under 35 U.S.C. 154(b) by 2 days.

(21) Appl. No.: 13/315,189

(22) Filed: Dec. 8, 2011

(65) Prior Publication Data

US 2012/0100705 A1 Apr. 26, 2012

Related U.S. Application Data

(62) Division of application No. 12/553,067, filed on Sep. 2, 2009.

(51) Int. Cl.
*H01L 21/336* (2006.01)

(52) U.S. Cl.
USPC ..... 438/270; 438/587; 438/589; 257/E21.658

(58) Field of Classification Search
USPC ................... 438/243, 270, 589; 257/E21.658
See application file for complete search history.

(56) References Cited

U.S. PATENT DOCUMENTS

| 5,627,095 A * | 5/1997 | Koh et al. ............. 438/672 |
| 2005/0259468 A1 | 11/2005 | Violette |
| 2008/0048229 A1* | 2/2008 | Staub et al. ............. 257/296 |

* cited by examiner

*Primary Examiner* — Hsin-Yi Hsieh
(74) *Attorney, Agent, or Firm* — WPAT, PC; Justin King

(57) ABSTRACT

A method for forming a memory cell transistor is disclosed which includes providing a substrate, forming a trench structure in the substrate, depositing a conductive substance on the surface of the substrate to form a conductive member inside the trench structure, forming one or more dielectric layers on the surface of the substrate, forming one or more first conductive layers on top of the dielectric layers, and etching the first conductive layers and the dielectric layers to form a hole structure extending through the first conductive and the dielectric layers, reaching to the substrate surface. One or more second conductive layers may be formed on top of the first conductive layers, with the second conductive layer material filling the hole structure.

13 Claims, 27 Drawing Sheets

METHOD FOR FORMING MEMORY CELL TRANSISTOR

CROSS-REFERENCE TO RELATED APPLICATIONS

This application is a divisional of U.S. application Ser. No. 12/553,067, filed on Sep. 2, 2009 and entitled METHOD FOR FORMING MEMORY CELL TRANSISTOR, the entire contents of which are hereby incorporated by reference.

FIELD OF THE INVENTION

The present invention is generally related to memory cell transistors, and more particularly to a structure of a memory cell transistor with associated word lines and bit lines, and a method for forming the same.

BACKGROUND OF THE INVENTION

A Dynamic Random Access Memory (DRAM) is a type of semiconductor arrangement for storing bits of data in separate storage capacitors within an integrated circuit. DRAMs commonly take the form of trench capacitor DRAM cells and stacked capacitor DRAM cells. In the latter, the storage capacitors are formed above read/write transistors. An advanced method of fabricating the latter form, developed by Qimonda, is the buried word line process, which involves the cell transistor gate electrode and word line being built in a trench in an active area (AA) and shallow trench isolation (STI) oxide. The buried word line process uses polysilicon and tungsten (W) wires as the bit lines in an array region (e.g., of the active area) and gate electrode technology in periphery-region transistors of the active area).

An advantage of the buried word line technology is that it reduces a contact layer, commonly referred to as the self-aligned contact (SAC) or landing pad contact (LPC), as compared to that of a the normal stacked capacitor DRAM cell.

In existing buried word line processes, the buried word line level is generally processed after active area definition via shallow trench isolation. Then, the bit line contacts are formed, and the needed bit lines are structured. FIG. 1 illustrates an example of an existing buried word line process, which is aimed at fabricating memory cell transistors in the end. Upper and lower portions of each of the series of drawings. FIG. 1A through FIG. 1K, portray respectively top-down and cross-sectional views of a conventional DRAM device 100 fabrication. As shown, DRAM device 100 comprises an array region 101 and a periphery region 102. It is noted that like elements in FIG. 1A through FIG. 1K are given like reference numerals and may not be repeated in every figure for simplicity of description.

In FIG. 1A, an active area definition process is performed where active areas (AA) 110 are defined on a substrate 103 (for example a doped silicon) for both the array region 101 and the periphery region 102 via shallow trench isolation (STI) 111. Next, in FIG. 1B, a trench etching process is performed to form a plurality of buried word line trenches 112 in the substrate 103. Next, in FIG. 1C, a gate oxidation process is performed to form an oxide layer (not shown) on the silicon surface of the trenches 112. This oxide layer may serve/function as the gate dielectric layer for the fabricated memory cell transistor of DRAM device 100. Then, a titanium nitride (TiN) deposition process and a tungsten (W) deposition process are performed to form a TiN layer, or TiN/W layer, or combination thereof, which is denoted as 113, in the formed trenches 112. In particular, it is formed on top of the gate oxide layer. Next, in FIG. 1D, an etching-back process is performed to selectively etch the formed TiN or TiN/W layer or their combination into the trenches 112. In one example, the remainder of the conductive titanium nitride layer 114 in the trenches 112 forms the gate electrode of the fabricated memory cell transistor of DRAM device 100, and the remainder of the conductive TiN/W layer (also denoted as 114) forms the needed word lines. In another example, the remainder of the conductive TiN layer, TiN/W layer or their combination (114) in the trenches 112 forms the gate electrode as well as the needed word line. Next, in FIG. 1E, a cap layer deposition process is performed to form a cap layer 115 which covers the processed surface in FIG. 1D. A chemical mechanical polishing (CMP) process may be performed to planarize the surface of the formed cap layer 115. The cap layer 115 is typically made of dielectric materials such as silicon nitride, silicon oxide, silicon oxynitride, or any combination thereof. Next, in FIG. 1F, a cap layer removal process is performed to remove the cap layers 115 in the periphery region 102. Next, in FIG. 1G, a periphery gate oxidation process is performed to form a gate oxide layer 150, such as the oxide layers formed in the trenches 112 in FIG. 1C, for the transistors in the periphery region 102.

Next, in FIG. 1H, the bit line contact is patterned on the intended surface of the DRAM device 100 being fabricated by using a mask, and a bit line contact etching process is performed to form bit line contact holes 116 through the cap layer 115. Next, in FIG. 1I, a polysilicon deposition process is performed to form a polysilicon layer 117 covering the processed surface in FIG. 1H, and then a metal deposition process is performed to form a better conducting (metal or metal-based) layer 118 covering the formed polysilicon layer 117. Particularly, polysilicon is deposited into and fills the contact hole 116 formed in FIG. 1H, thereby forming the desired bit line contact plugs 116'. The deposited metal or metal-based material may be titanium (Ti), titanium nitride (TiN), tungsten (W), or any combination thereof. In one example, the metal or metal-based layer 118 is selected to be a titanium nitride/tungsten (TiN/W) layer.

Next, in FIG. 1J, a hardmask layer deposition process is performed for achieving better resolution and profile control of the fabricated DRAM device 100. In one example, the formed hardmask layer 119 also can serve/function as an anti-reflective coating (ARC) layer on top of the metal or metal-based layer 118 formed in FIG. 1I. Finally in FIG. 1K, a bit line mask is applied to pattern the bit lines, and a bit line etching process is performed to form the needed bit lines 120. In some cases, the formed bit line 120 comprises the polysilicon layer 117 and the metal or metal-based layer 118 as well.

In some cases, the formation of the bit line contact may involve performing bit line contact photolithography and etching processes on or around the formed periphery gate oxide 150. For such cases, damage or contamination may be caused to the gate oxide 150 of periphery transistors.

Also, as can be seen in FIG. 1H, the window for etching the cap layer 115 to form the bit line contact hole 116 is quite small, as the cap layer 115 is typically very thin (~few hundred Å). This may cause additional difficulty for process control of the formation of the intended bit lines.

In addition, an endless desire for a simpler process as well as a simpler device structure has driven the research towards advanced formation methods and structures for the individual components in a stacked DRAM device, such as the word line structure, the bit line structure, the gate structure or the dope region structure, etc.

SUMMARY OF THE INVENTION

In one embodiment of the present invention, a method for forming a memory cell transistor is disclosed. The method comprises providing a substrate, forming a trench structure in the substrate, depositing a conductive substance on the surface of the substrate wherein the conductive substance at least partially occupies the inner space of the trench structure thereby forming a conductive member inside the trench structure, forming one or more dielectric layers on the surface of the substrate wherein the dielectric layers cover the trench structure and the conductive member therein, forming one or more first conductive layers on top of the dielectric layers, and etching the first conductive layers and the dielectric layers to form a hole structure wherein the hole structure extends through the first conductive layers and the dielectric layers, reaching to the surface of the substrate.

In another embodiment of the present invention, a memory cell transistor structure is disclosed. The disclosed memory cell transistor comprises a substrate which comprises a trench structure, wherein the trench structure comprises an oxide layer formed on its inner surface and a conductive member which at least partially occupies the inner space of the trench structure. The memory cell transistor also comprises one or more dielectric layers formed on top of the substrate, wherein the dielectric layers cover the trench structure and the conductive member therein. The memory cell transistor also comprises one or more first conductive layers formed on top of the dielectric layers, and one or more second conductive layers formed on top of the first conductive layers, wherein a hole structure is formed from the surface of the top first conductive layer, extending through the first conductive layers and the dielectric layers, reaching the surface of the substrate, and wherein the second conductive layer material fills the hole structure.

DESCRIPTION OF THE EXEMPLARY EMBODIMENTS

Although the present invention will be described in accordance with the embodiments shown below, one of ordinary skill in the art will readily recognize that there can be variations to the embodiments which variations would be within the spirit and scope of the present invention. Accordingly, many modifications may be made by one of ordinary skill in the art without departing from the spirit and scope of the appended claims.

As mentioned above, in the general buried word line technology, the bit line contact etching process is performed before the polysilicon deposition. The cap layer is etched such that a contact hole is formed through the cap layer, reaching into (e.g. underneath) the substrate. Then, the polysilicon deposition is performed to form a polysilicon layer on top of the cap layer. Polysilicon is deposited into and fills the formed contact hole thereby forming a polysilicon contact plug. The formed polysilicon contact plug directly contacts (e.g. underneath) the substrate.

Figure 1A:
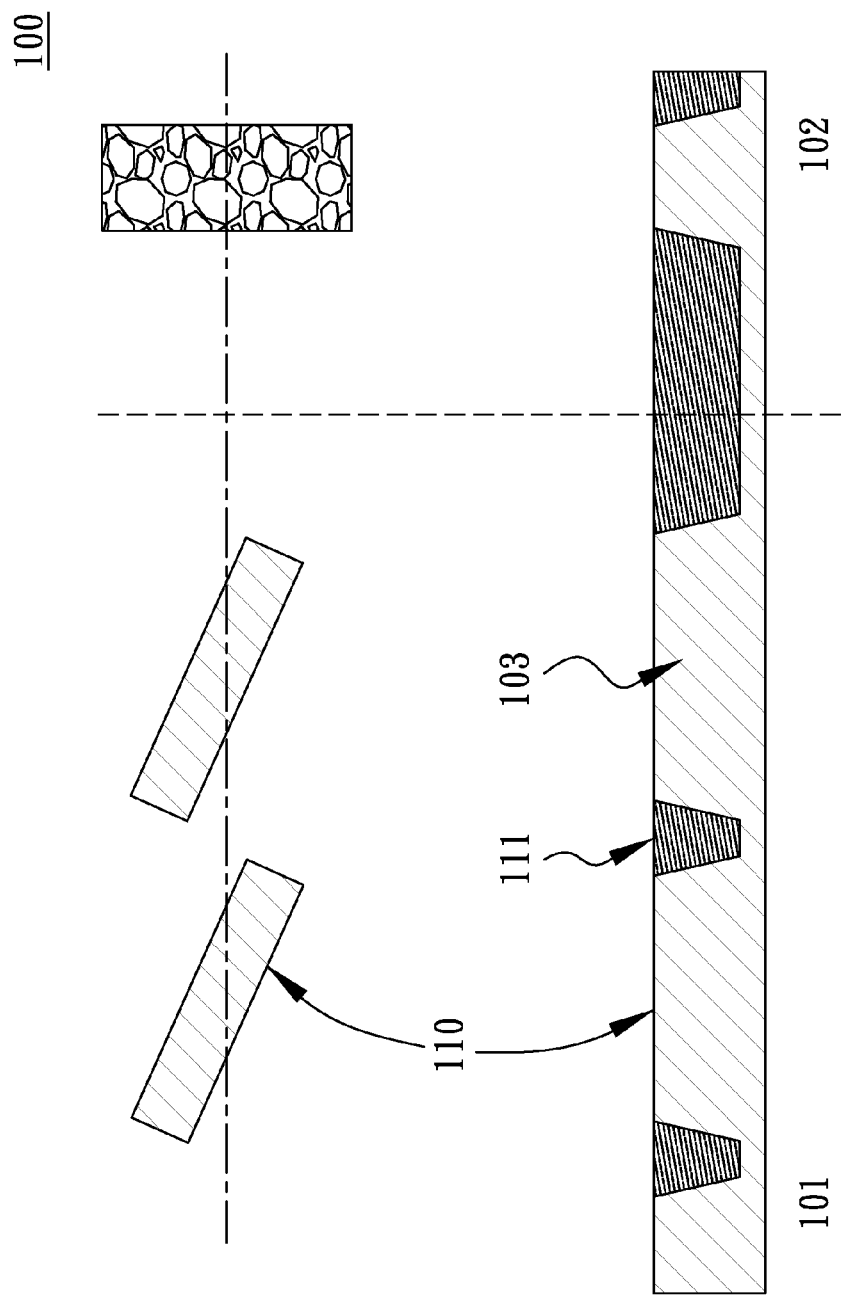
FIGS. 1A-1K illustrate an example of an existing buried word line process.
Figure 1B:
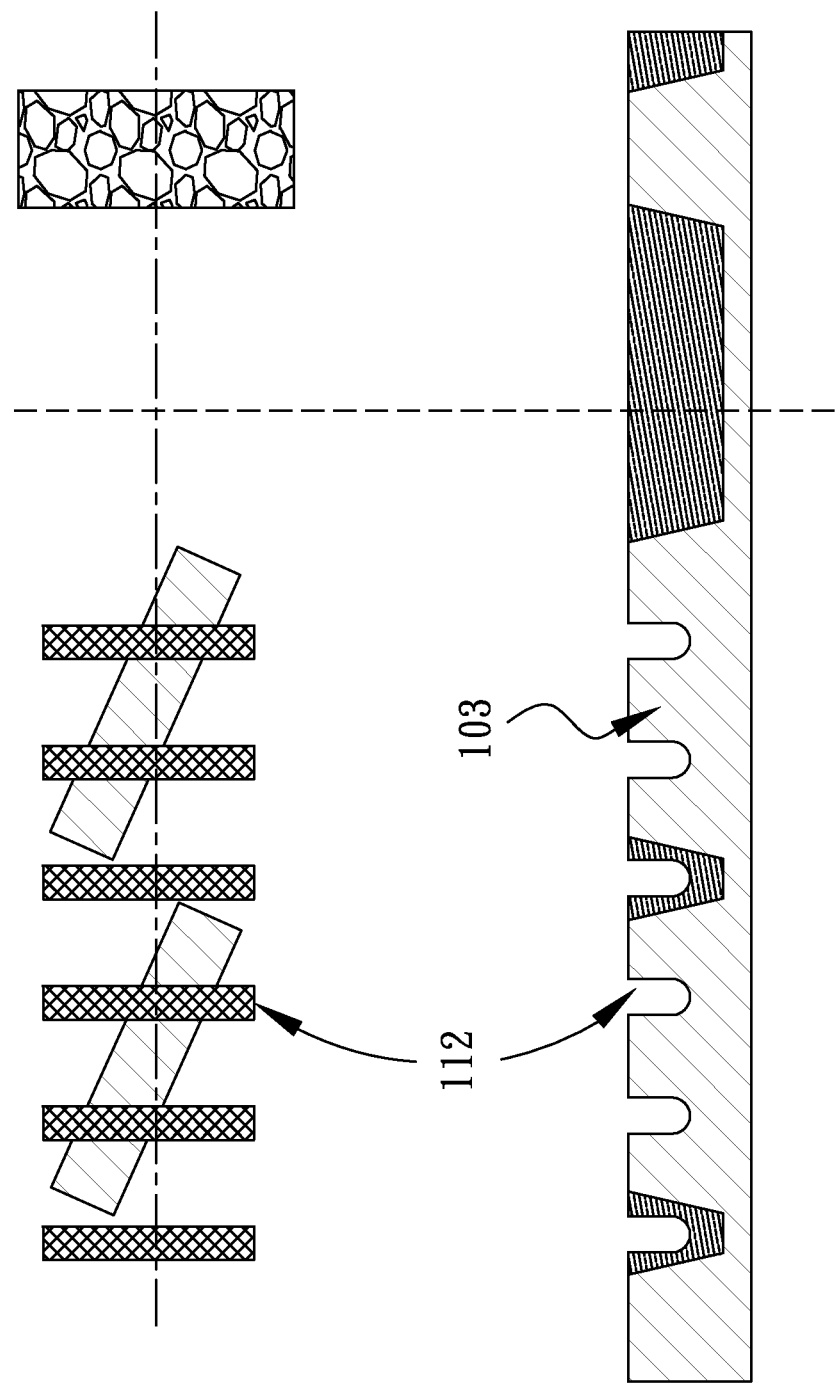
Figure 1C:
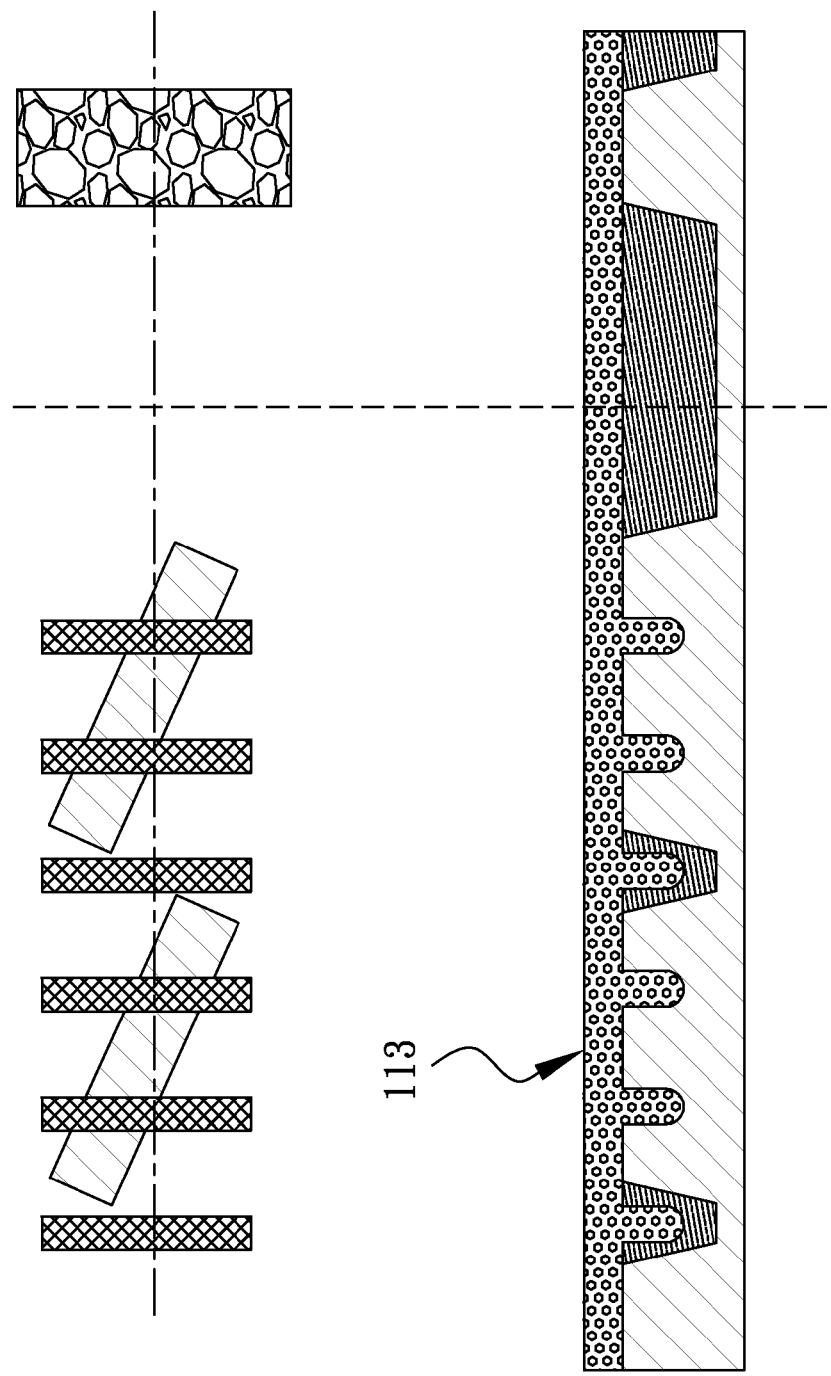
Figure 1D:
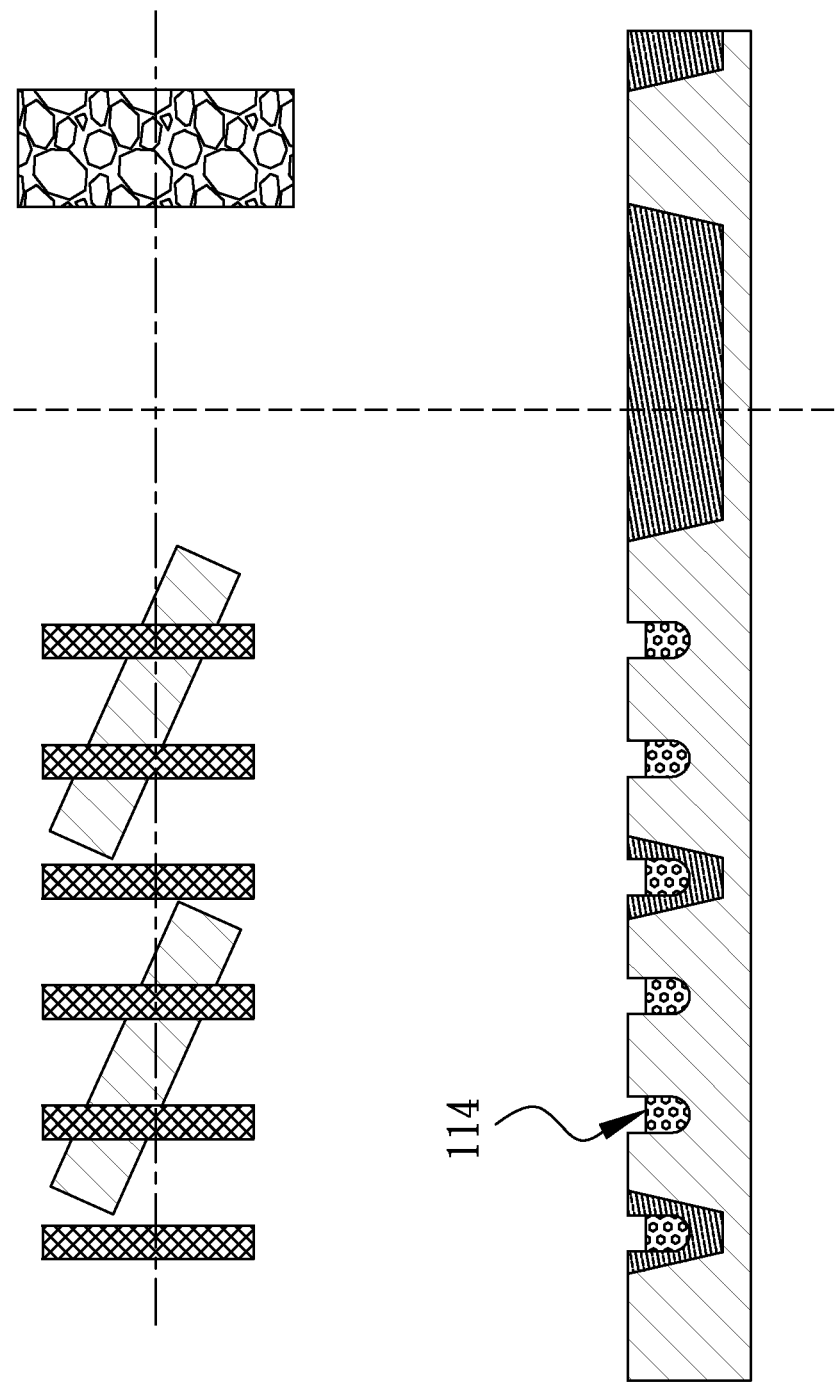
Figure 1E:
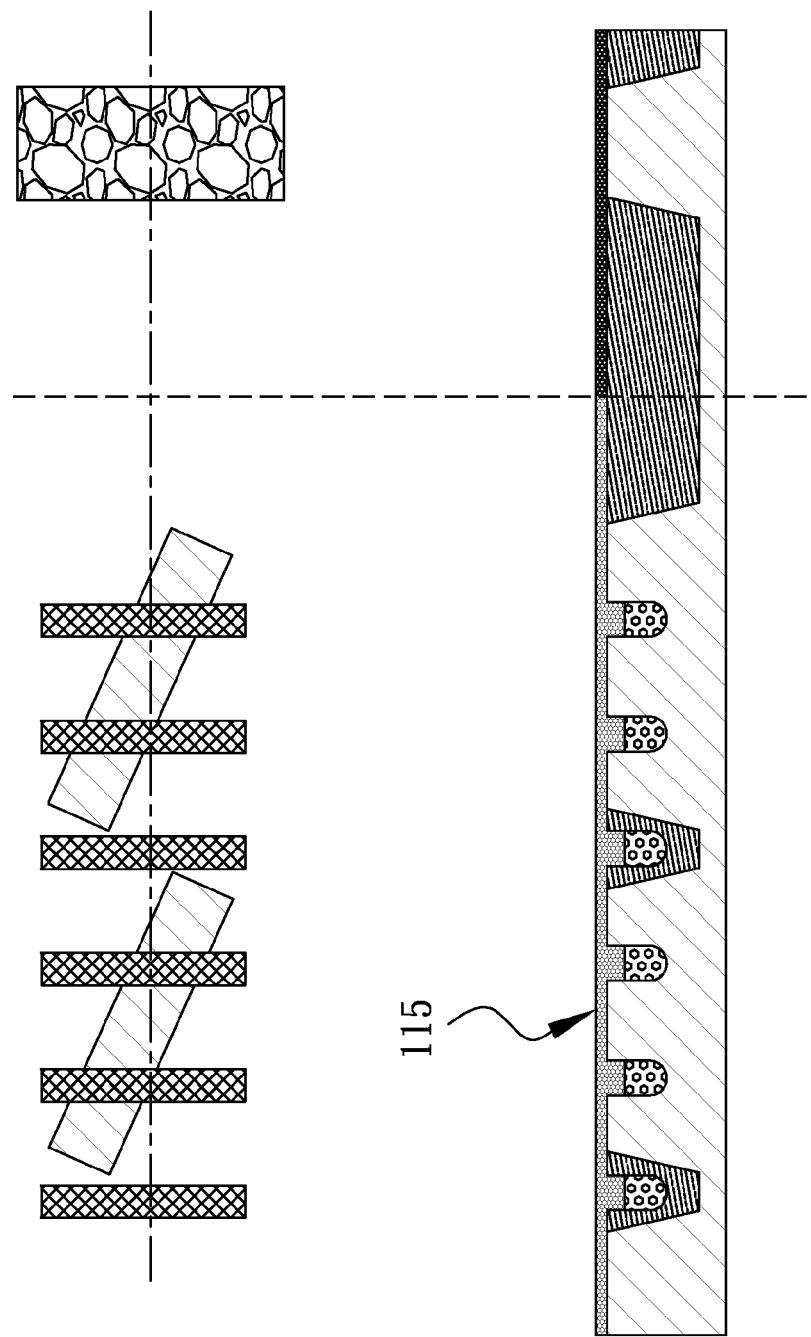
Figure 1F:
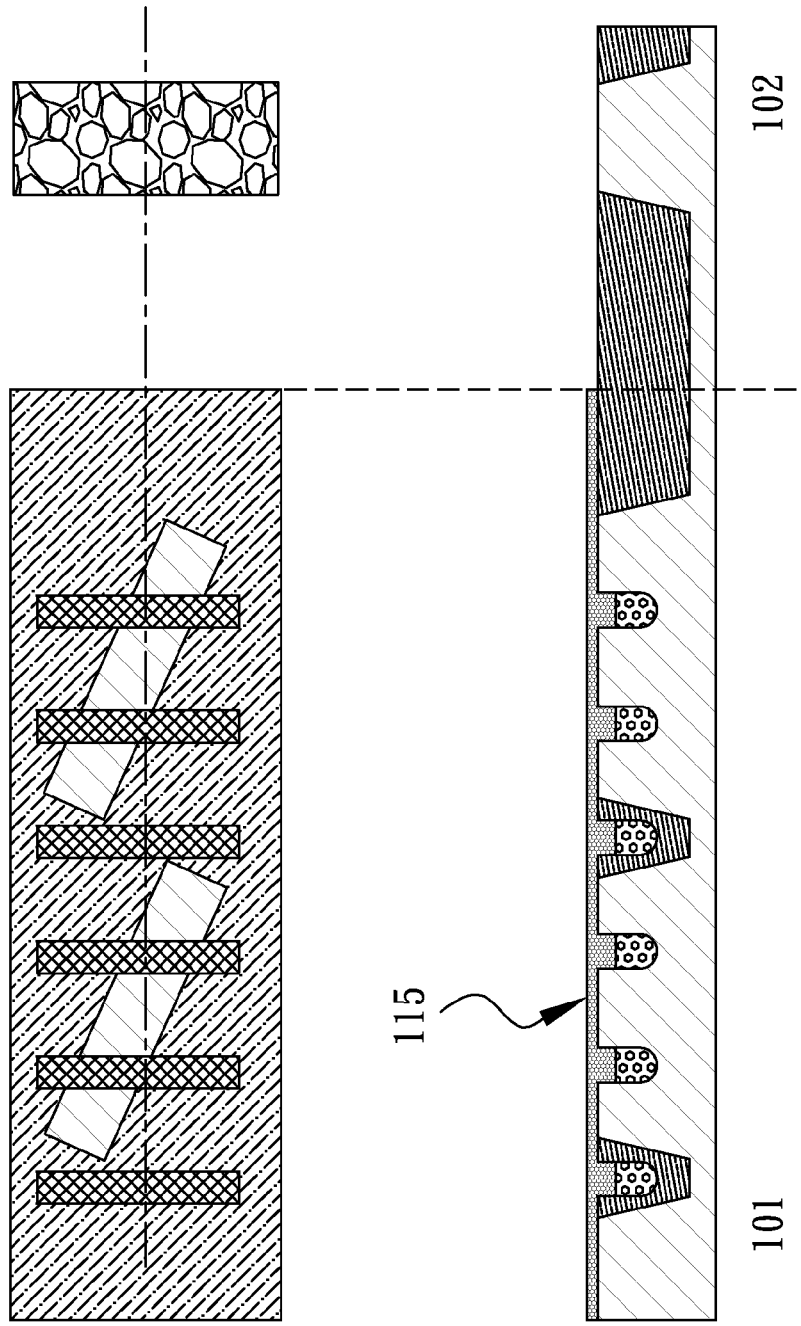
Figure 1G:
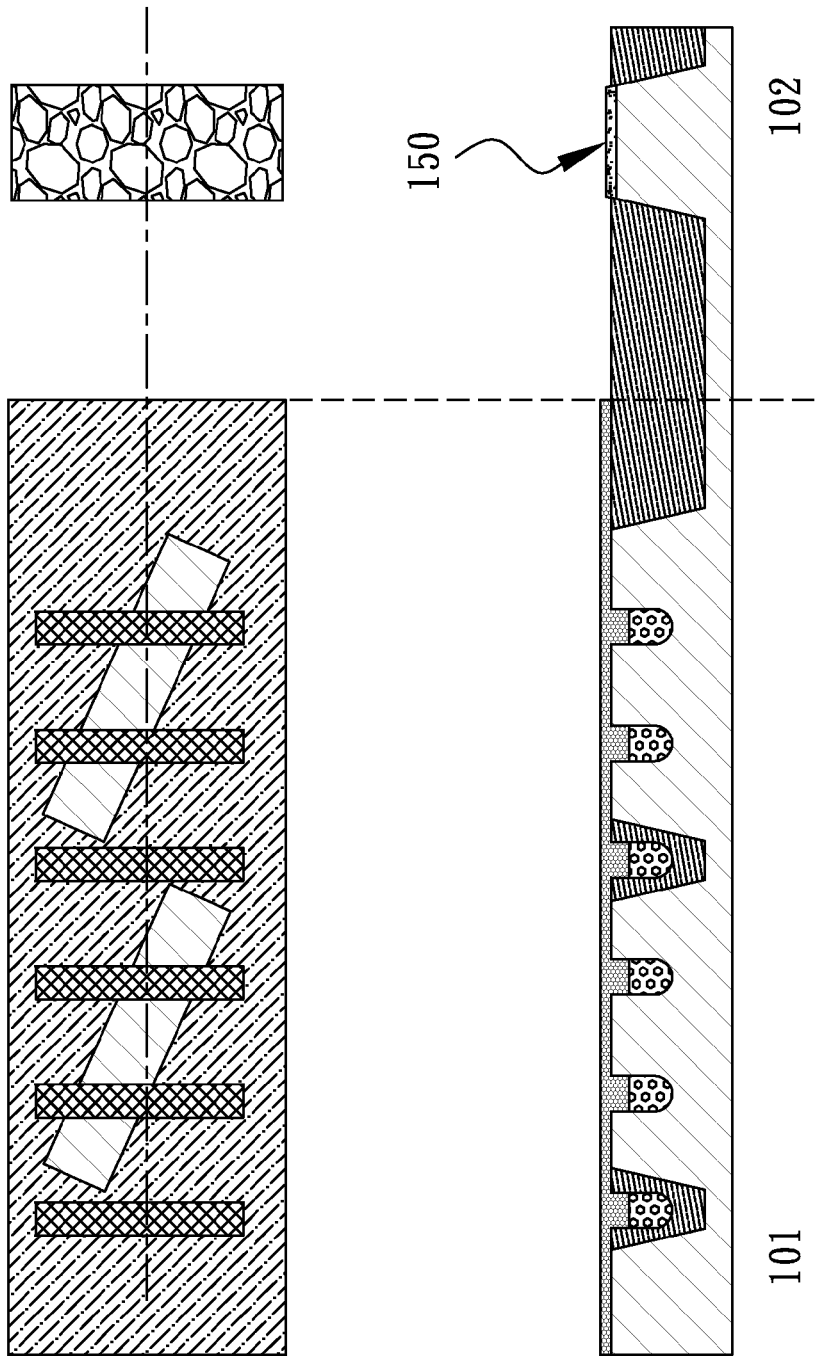
Figure 1H:
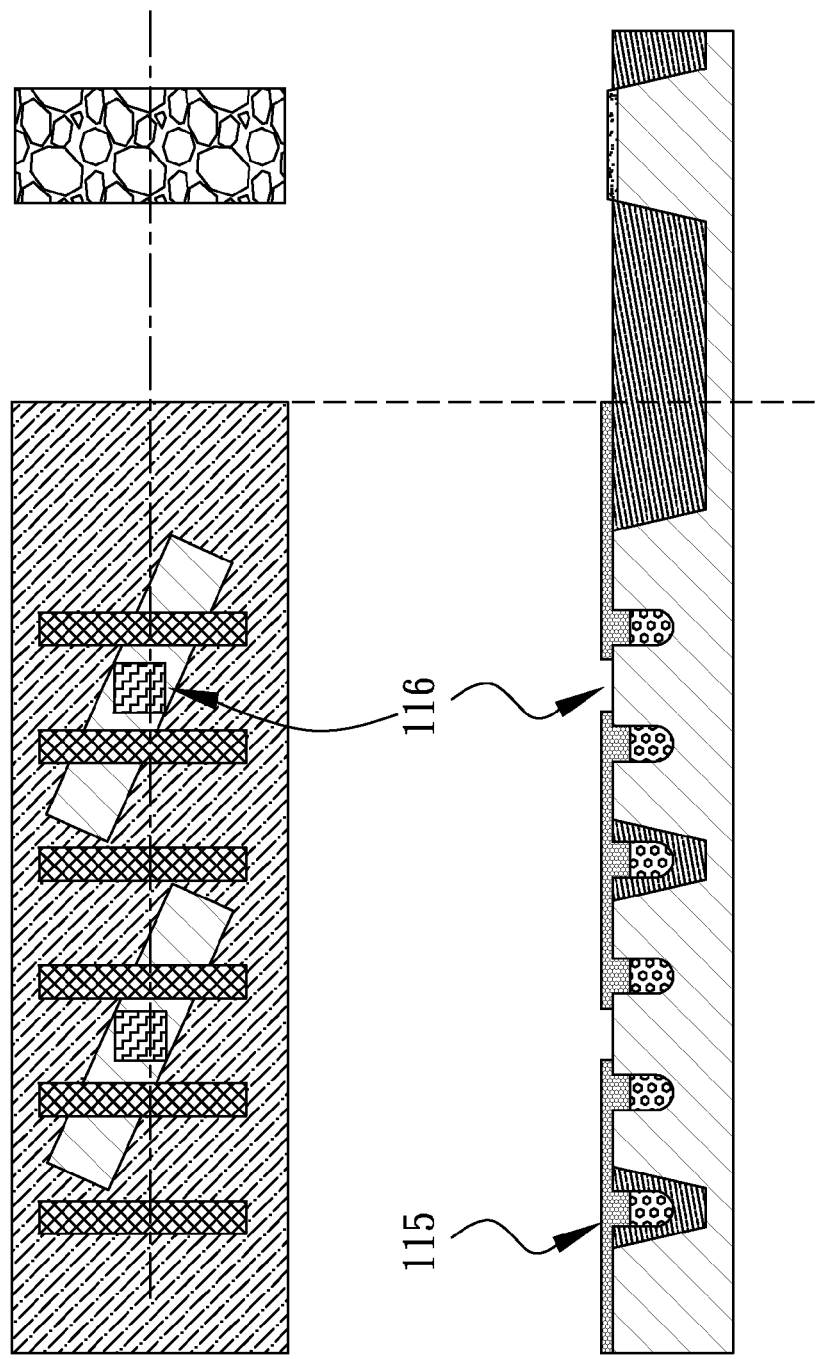
Figure 1I:
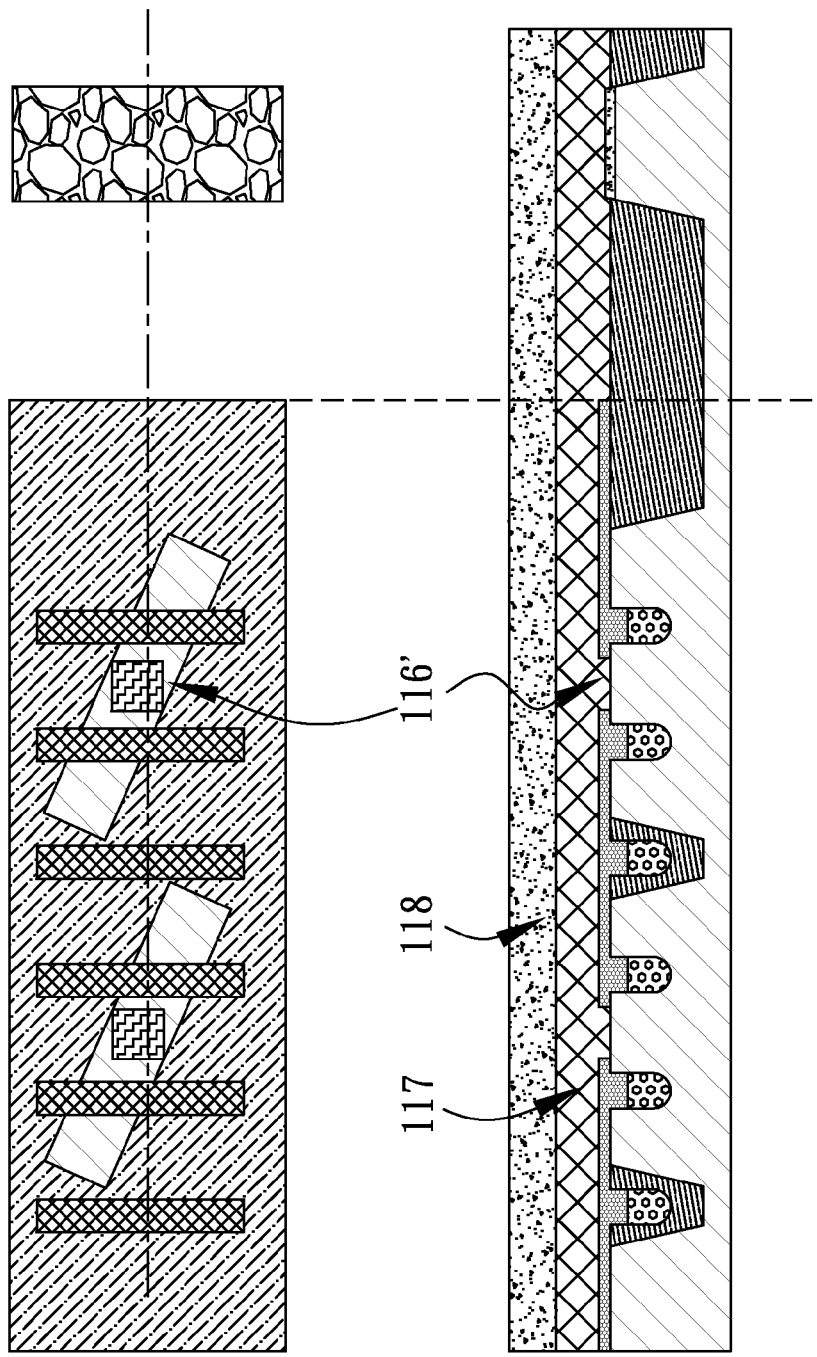
Figure 1J:
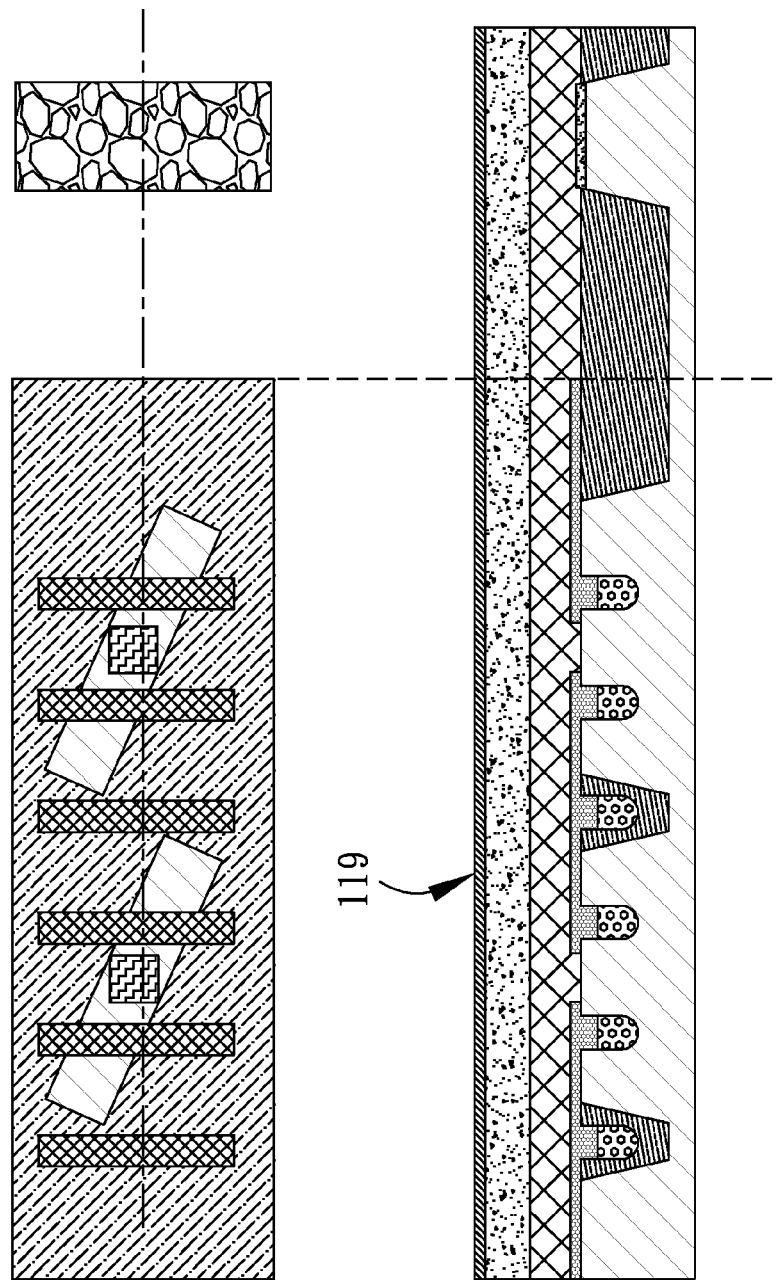
Figure 1K:
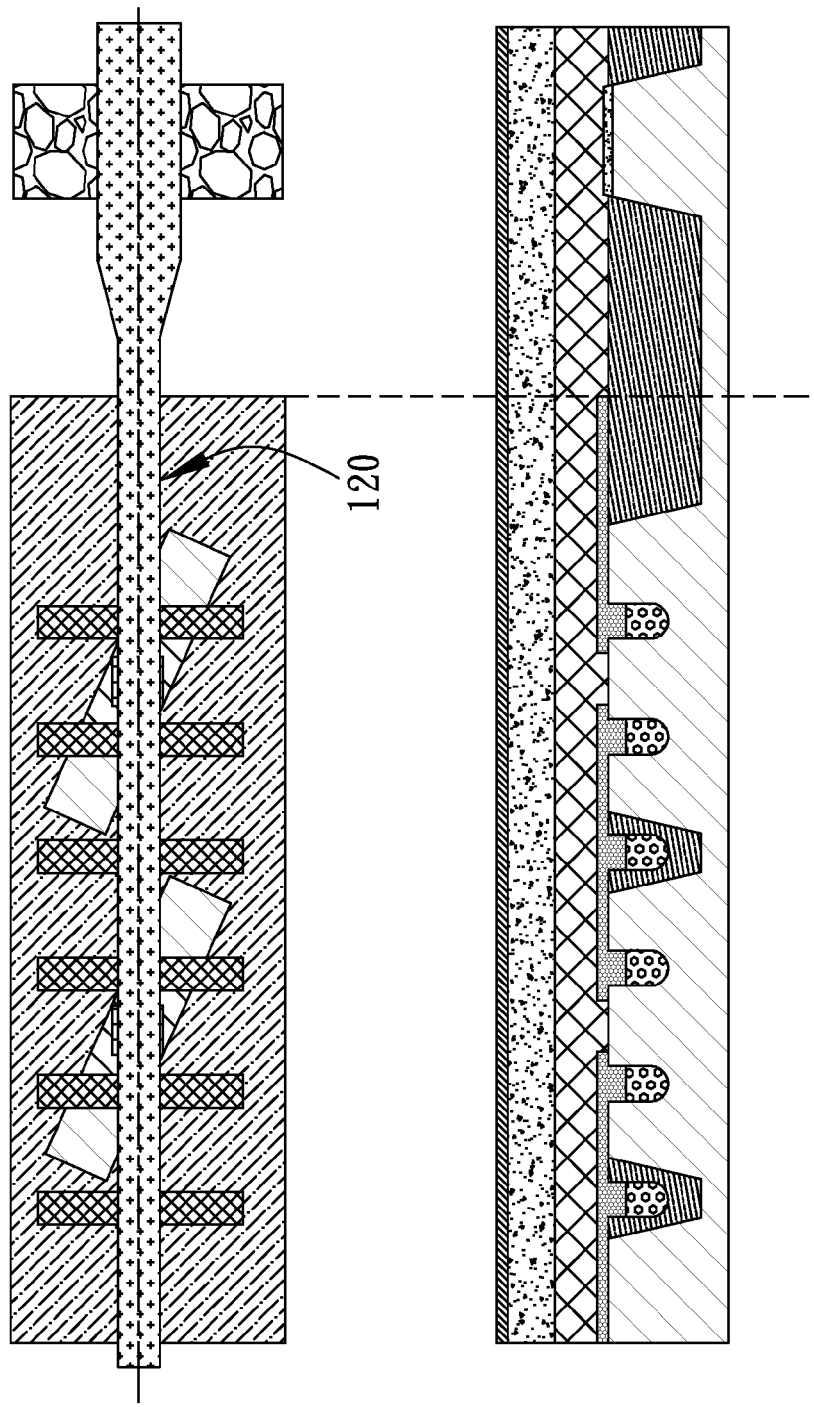
Figure 2:
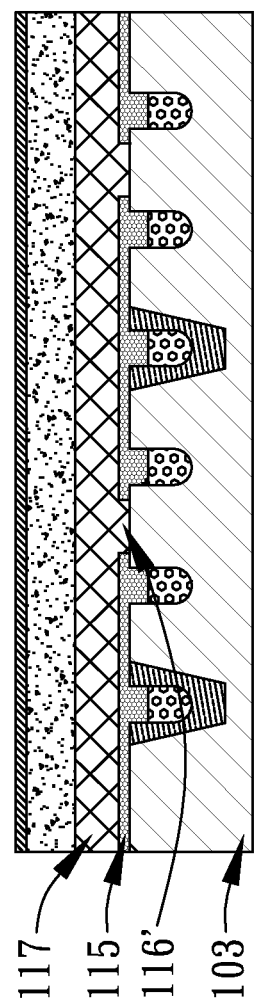
FIG. 2 is a schematic illustration of the structure of a memory cell transistor in accordance with the existing general buried word line technology.

This can be seen in FIG. 2, which is a schematic illustration of the structure of a memory cell transistor in accordance with the existing general buried word line process. Like reference numerals are used here to denote like elements as in the previous embodiment (FIG. 1) where applicable. As shown, the bit line contact plugs 116' are made of polysilicon as a result of polysilicon depositing into the contact hole 116 during the formation of polysilicon layer 117. The formed bit line contact plugs 116' extend through the cap layer 115 and are in direct contact with the substrate 103.

In one embodiment of the present invention, the bit line contact etching process is performed after the polysilicon deposition. The polysilicon layer is etched such that a contact hole is formed through the polysilicon layer and the cap layer underneath, reaching even to the substrate underneath. Then, deposition of metal or a metal-based material such as TiN/W is performed to form a stacked metal or metal-based layer on top of the polysilicon layer. The metal or metal-based material is deposited into and fills the formed contact hole thereby forming a metal or metal-based contact plug. The formed contact plug directly contacts the substrate.

Figure 3:
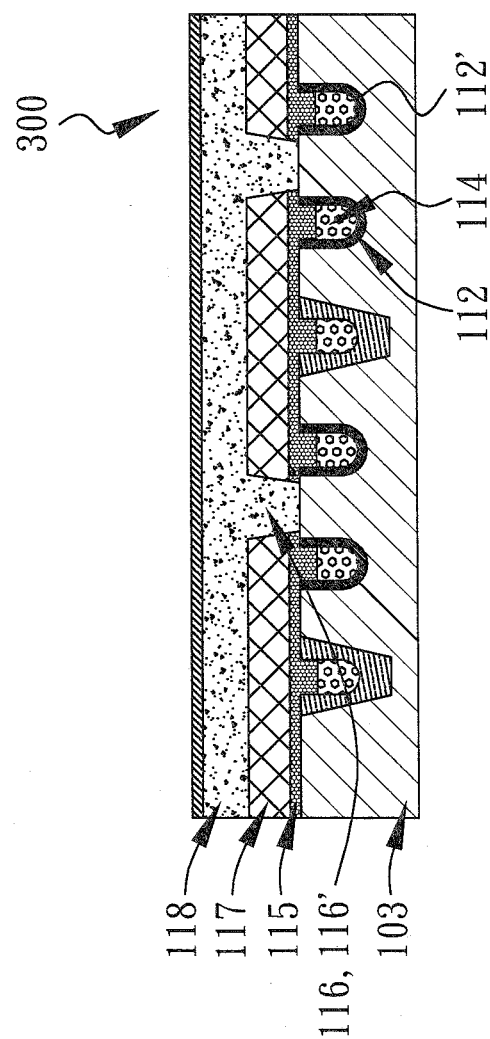
FIG. 3 is a schematic illustration of the structure of a memory cell transistor in accordance with an embodiment of the present invention.

This can be seen in FIG. 3, which is a schematic illustration of the structure of a memory cell transistor in accordance with an embodiment of the present invention. Like reference numerals are used here to denote like elements as in the previous embodiment (FIGS. 1 and 2) where applicable. As shown, a memory cell transistor 300, such as a dynamic random access memory (DRAM) cell transistor, comprises a substrate 103, one or more dielectric layers (i.e. the cap layer) 115 formed on top of the substrate 103, one or more first conductive layers (i.e. the polysilicon layer) 117 formed on top of the dielectric layers 115, and one or more second conductive layers (i.e. the more conducting metal or metal-based layer) 118 formed on top of the first conductive layers 117, wherein the substrate 103 comprises a trench structure (i.e. the buried word line trench) 112 thereon, and the trench structure 112 has therein a conductive member (i.e. the remaining conductive TiN/W deposition after an etching process) 114. The conductive member 114 at least partially occupies the inner space of the trench structure 112. In one example, the conductive member 114 services/functions as the gate electrode and word line as well for the memory cell transistor 300.

Also as shown, a hole structure (i.e. the bit line contact hole) 116 is formed from the surface of the top first conductive layer 117, extending downwards through the first conductive layers 117 and the dielectric layers 115, and reaching the surface of the substrate 103. In addition, the second conductive layer (118) material fills the hole structure 116 thereby forming a plug 116'. In one example, the plug 116' serves/functions as the bit line contact plug for the memory cell transistor 300, and the first conductive layer 117 serves/functions as the bit line structure for the memory cell transistor 300. Also noted that as shown in FIG. 3, the trench structure 112 and the conductive member 114 are covered by the dielectric layers 115.

More details of the memory cell transistor 300 will be described in conjunction with FIG. 4 and FIG. 5 which illustrate a formation method for memory cell transistor 300 in accordance with an embodiment of the present invention.

Figure 4:
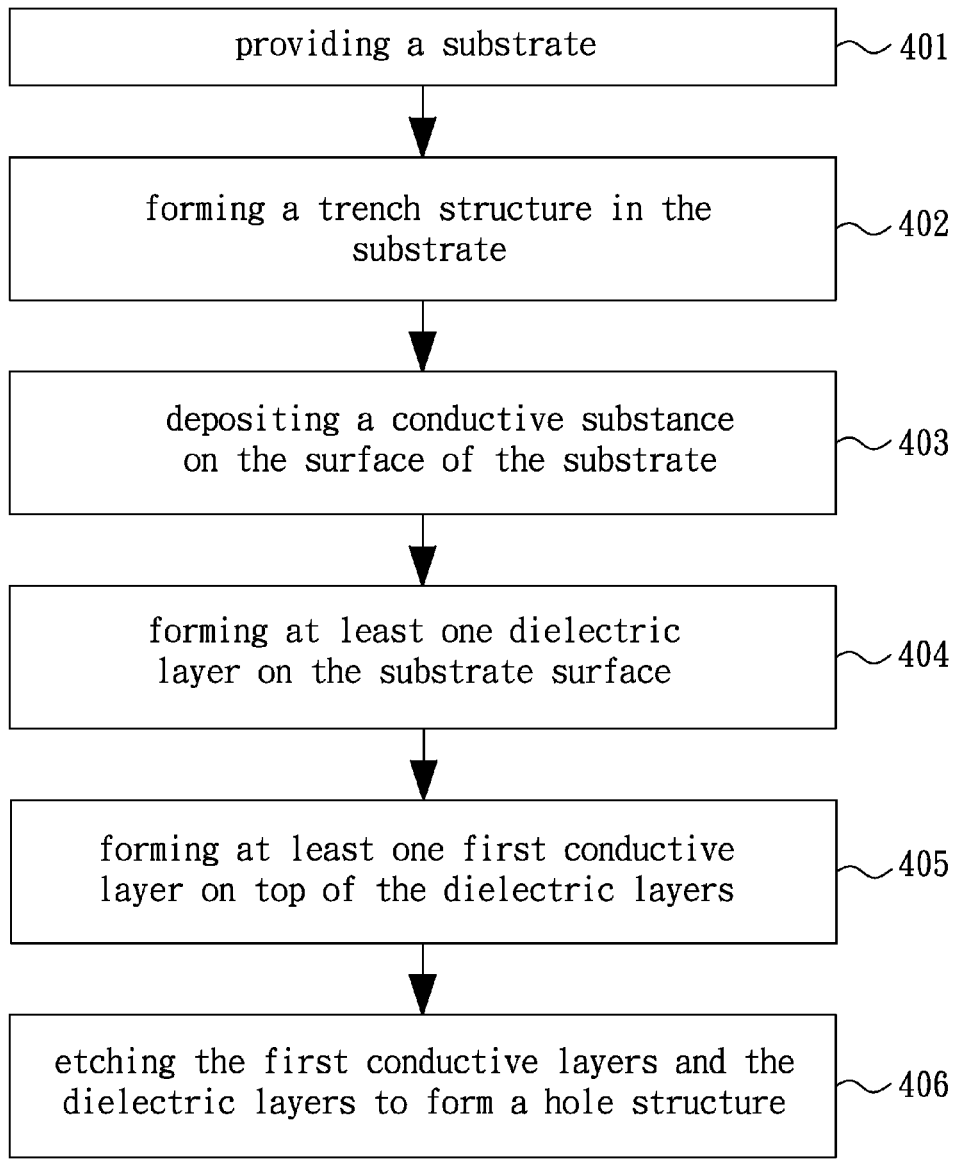
FIG. 4 illustrates a method flowchart for forming the memory cell transistor in FIG. 3 in accordance with an embodiment of the present invention.

FIG. 4 illustrates a method flowchart for forming the memory cell transistor 300 in FIG. 3 in accordance with an embodiment of the present invention. Like terms and numerals are adopted in describing the disclosed method to denote like elements in the embodiment in FIG. 3 where applicable.

As shown in FIG. 4, in step 401, a substrate (103) is provided. Then in step 402, a trench structure (112) is formed in the substrate. Next in step 403, a conductive substance is deposited on the surface of the substrate. Next in step 404, one or more dielectric layers (115) is formed on the substrate surface. Next in step 405, one or more first conductive layers (117) is formed on top of the dielectric layers. Next in step 406, the first conductive layers and the dielectric layers are etched to form a hole structure (116). The formed hole structure should extend downwards through the first conductive layers and the dielectric layers and reaching to the surface of the substrate.

In one example, the method may further comprise forming one or more second conductive layers (118) on top of the first conductive layers, wherein the second conductive layer material is deposited into and fills the hole structure, thereby forming a plug.

In one example, the second conductive layer, together with the first conductive layer, serve/function as the bit line structure for the memory cell transistor 300.

In one example, the deposition of the conductive substance (step 403) may further comprise forming a layer of a conductive substance on the surface of the substrate, and then selectively etching the layer of the conductive substance into the trench structure.

In one example, an oxide layer (112') may be formed on the inner (silicon) surface of the trench structure prior to the deposition of the conductive substance.

In the current embodiment, the conductive substance forming the conductive member (114) may comprise titanium nitride (TN), tungsten (W), or any combination thereof. The dielectric layer (115) may be formed from a substance comprising silicon nitride, silicon oxide, silicon oxynitride, or any combination thereof. The first conductive layer (117) may be formed from a substance comprising polysilicon. The second conductive layer (118) may be formed from a substance comprising titanium (Ti), titanium nitride, tungsten, or any combination thereof.

FIG. 5 illustrates a buried word line process in accordance with an embodiment of the present invention. The process is aimed to fabricate memory cell transistors in the end. In the series drawings of FIG. 5A through FIG. 5M, a top-down view and a cross-sectional view of a DRAM device 500 being fabricated are illustrated at the top and bottom, respectively. As shown, DRAM device 500 comprises an array region 501 and a periphery region 502. It is noted that like elements in FIG. 5A through FIG. 5M are given like reference numerals and may not be repeated in every figure for simplicity of description.

Figure 5A:
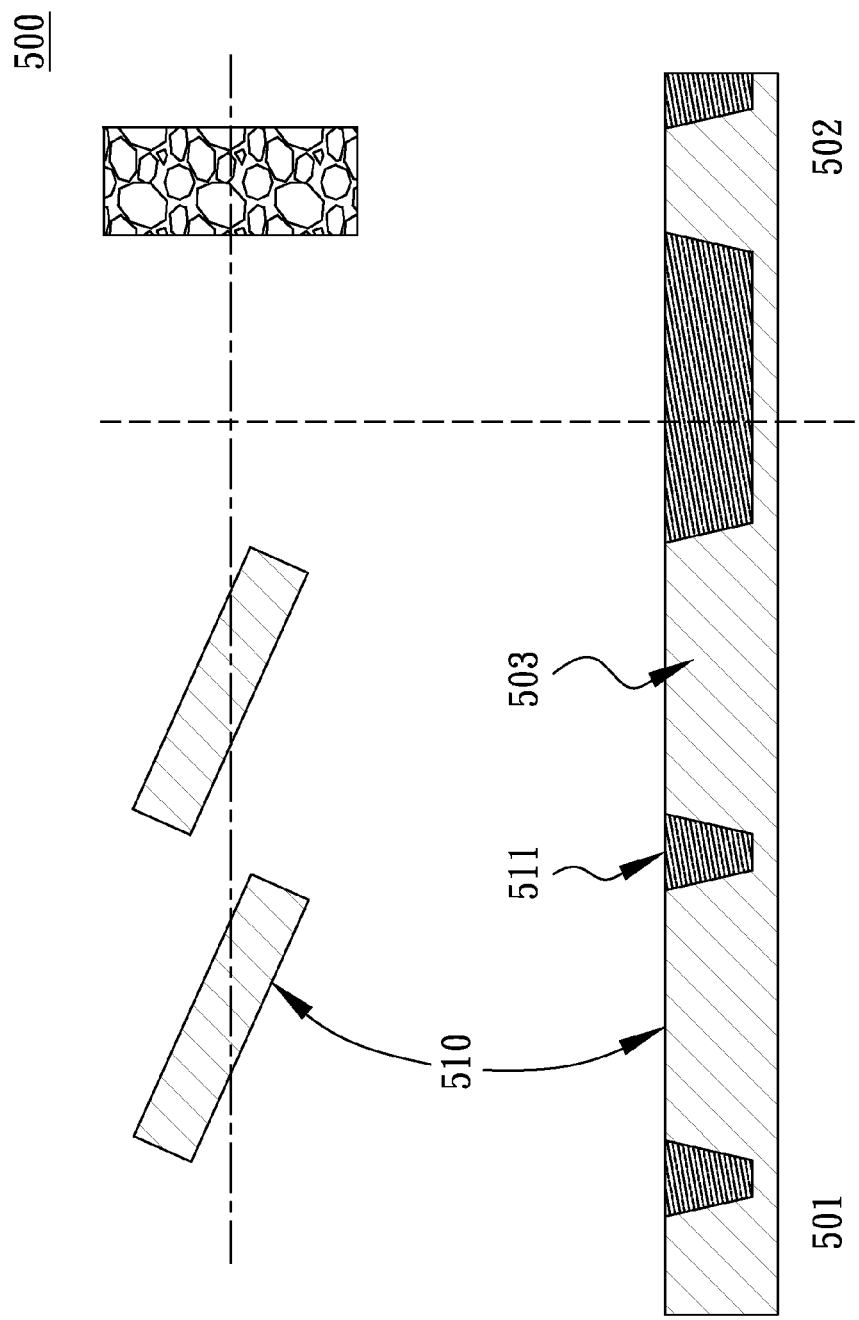
FIGS. 5A-5M illustrate a buried word line process in accordance with an embodiment of the present invention.
Figure 5B:
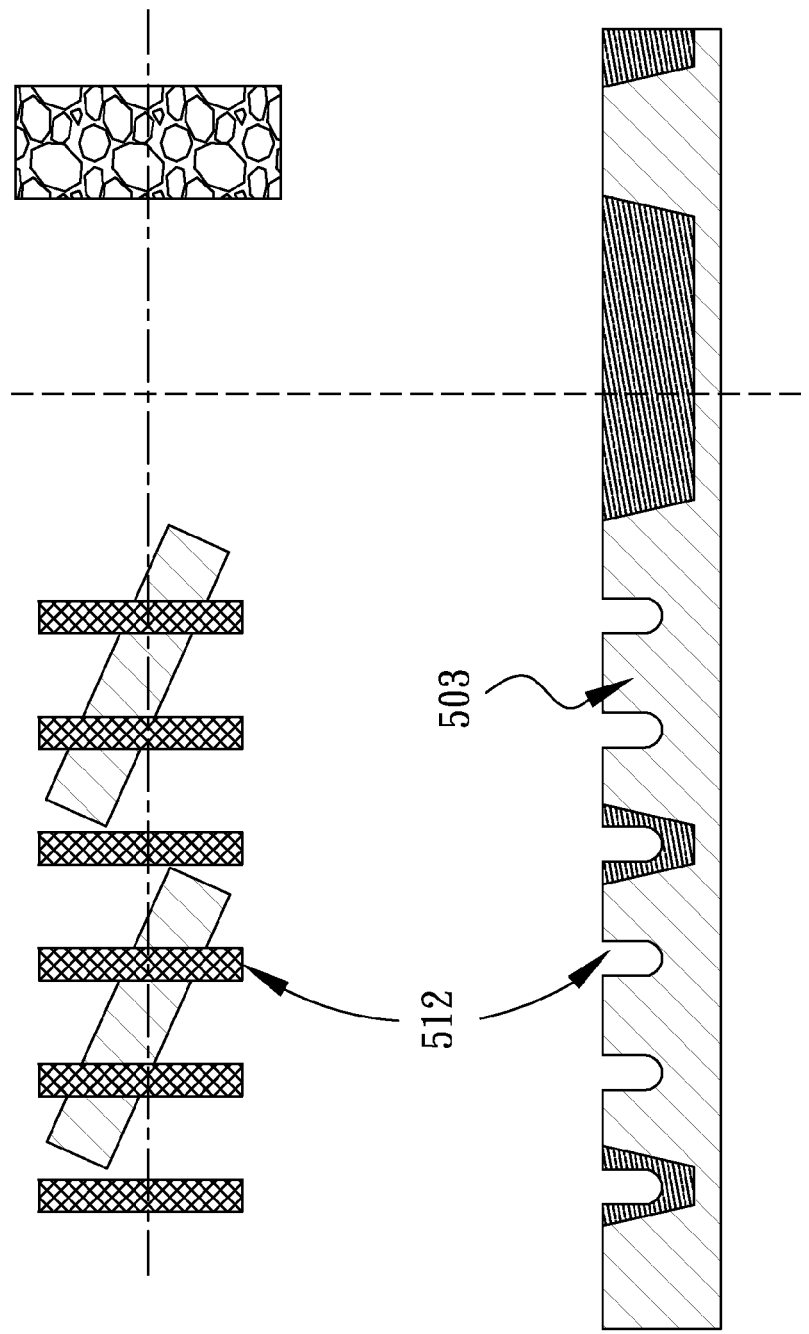
Figure 5C:
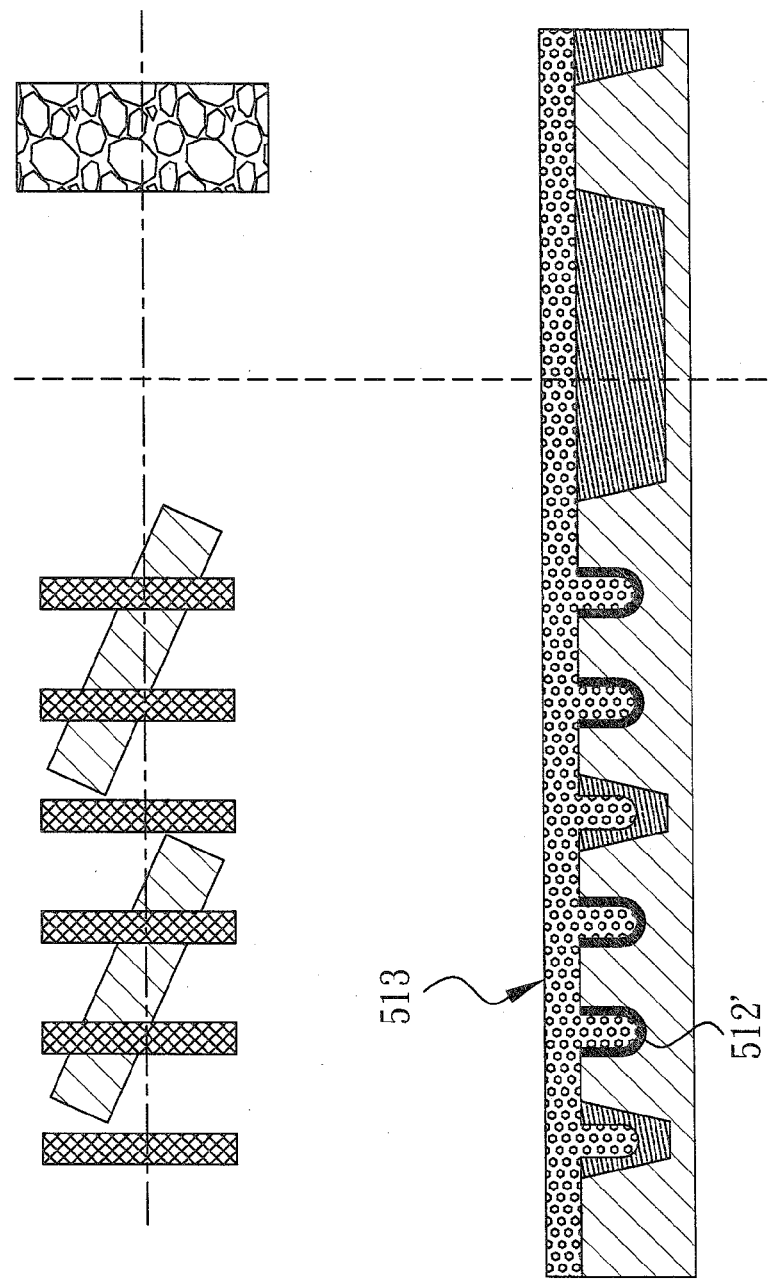
Figure 5D:
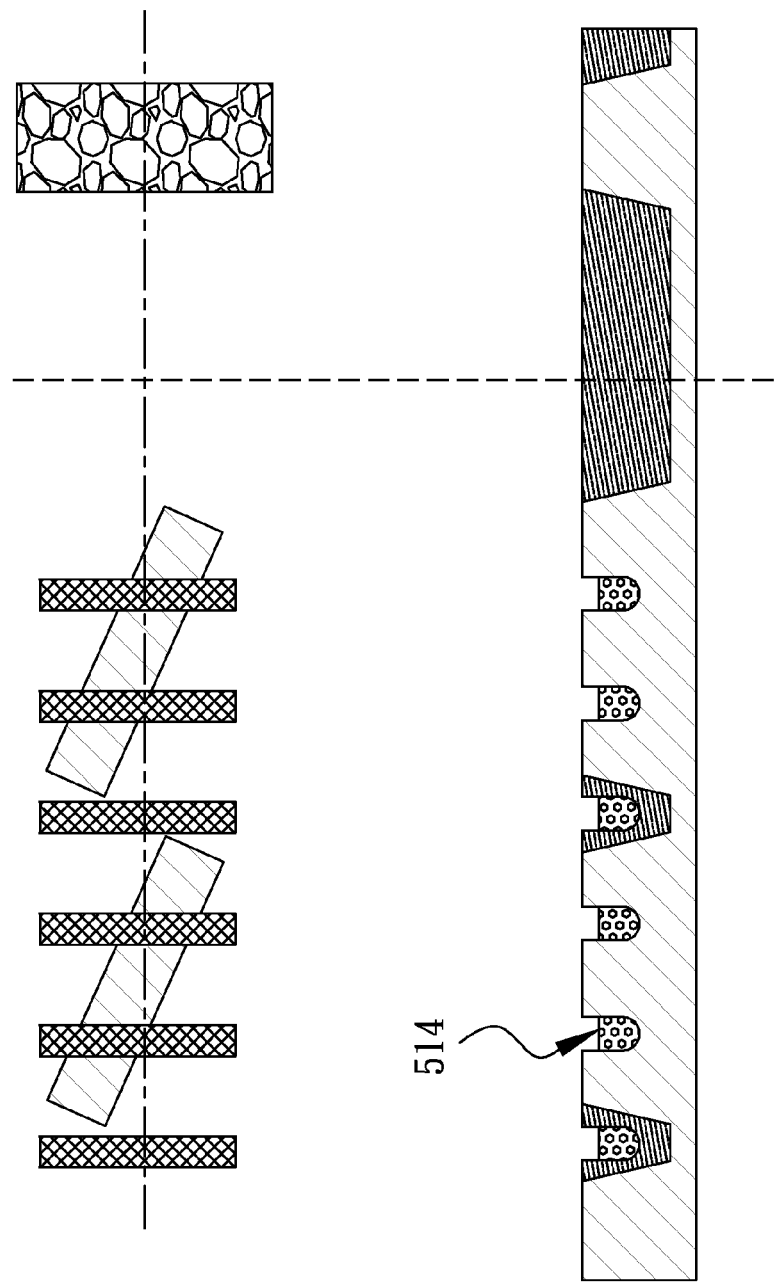

In FIG. 5A, an active area definition process is performed where active areas (AA) 510 are defined on a substrate 503 (for example a doped silicon) for both an array region 501 and a periphery region 502 via shallow trench isolation (STI) 511. Next, in FIG. 5B, a trench etching process is performed to form a plurality of buried word line trenches 512 in the substrate 503. Next, in FIG. 5C, a gate oxidation process is performed to form an oxide layer 512' on the silicon surface of the trenches 512. This oxide layer 512' may serve/function as the gate dielectric layer for the fabricated memory cell transistor. Then, a titanium nitride (TiN) deposition process and a tungsten (W) deposition process are performed to form a TiN layer, or TiN/W layer, or combination thereof, which is denoted as 513, in the formed trenches 512. In particular, it is formed on top of the gate oxide layer 512'. Next, in FIG. 5D, an etching-back process is performed to selectively etch the formed TiN or TiN/W layer or their combination into the trenches 512. In one example, the remainder of the conductive titanium nitride layer, denoted as 514, in the trenches 512 forms the gate electrode of the fabricated memory cell transistor, and the remainder of the conductive TiN/W layer (also denoted as 514) forms the needed word lines. In another example, the remainder of the conductive TiN layer, TiN/W layer or their combination (514) in the trenches 512 forms the gate electrode as well as the needed word line. Next, in FIG. 5E, a cap layer deposition process is performed to form a cap layer 515 which covers the processed surface in FIG. 5D. A chemical mechanical polishing (CMP) process may be performed to planarize the surface of the formed cap layer 515. The cap layer 515 is typically made of dielectric materials such as silicon nitride, silicon oxide, silicon oxynitride, or any combination thereof. Next, in FIG. 5F, a cap layer removal process is performed to remove the cap layers 515 in the periphery region 502. Next, in FIG. 5G, a periphery gate oxidation process is performed to form a gate oxide layer 550, such as the oxide layers 512' formed in the trenches 512 in FIG. 5C, for the transistors in the periphery region 502.

Figure 5E:
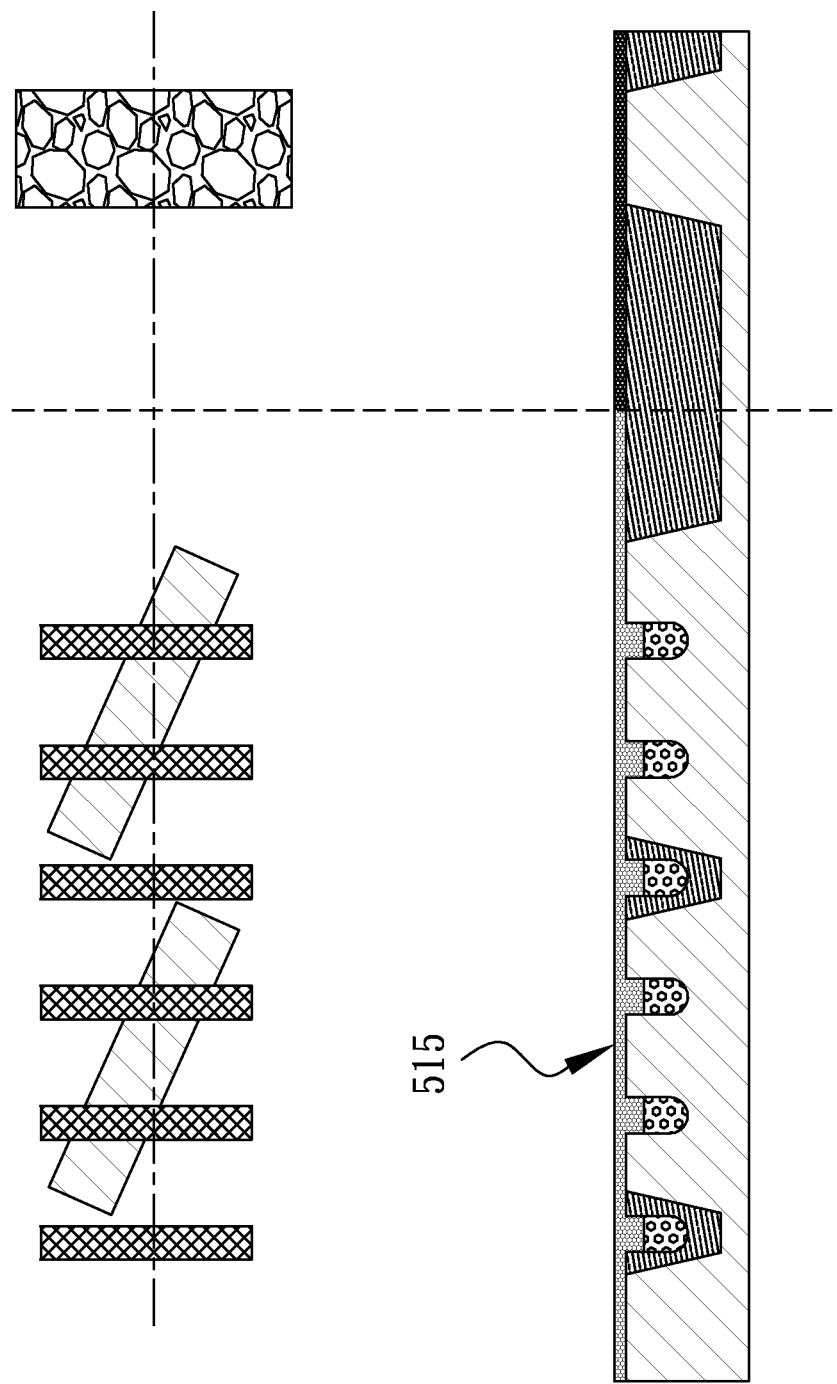
Figure 5F:
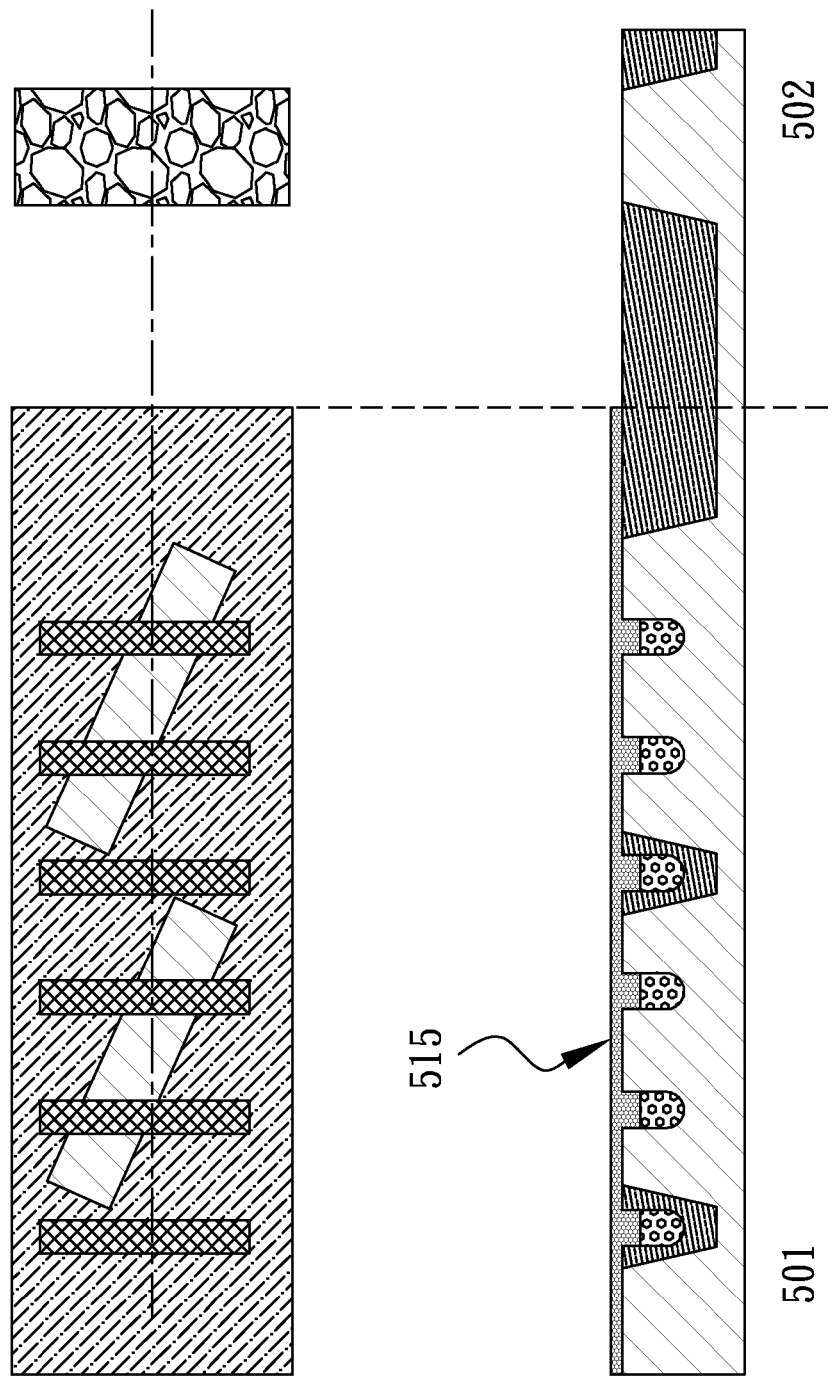
Figure 5G:
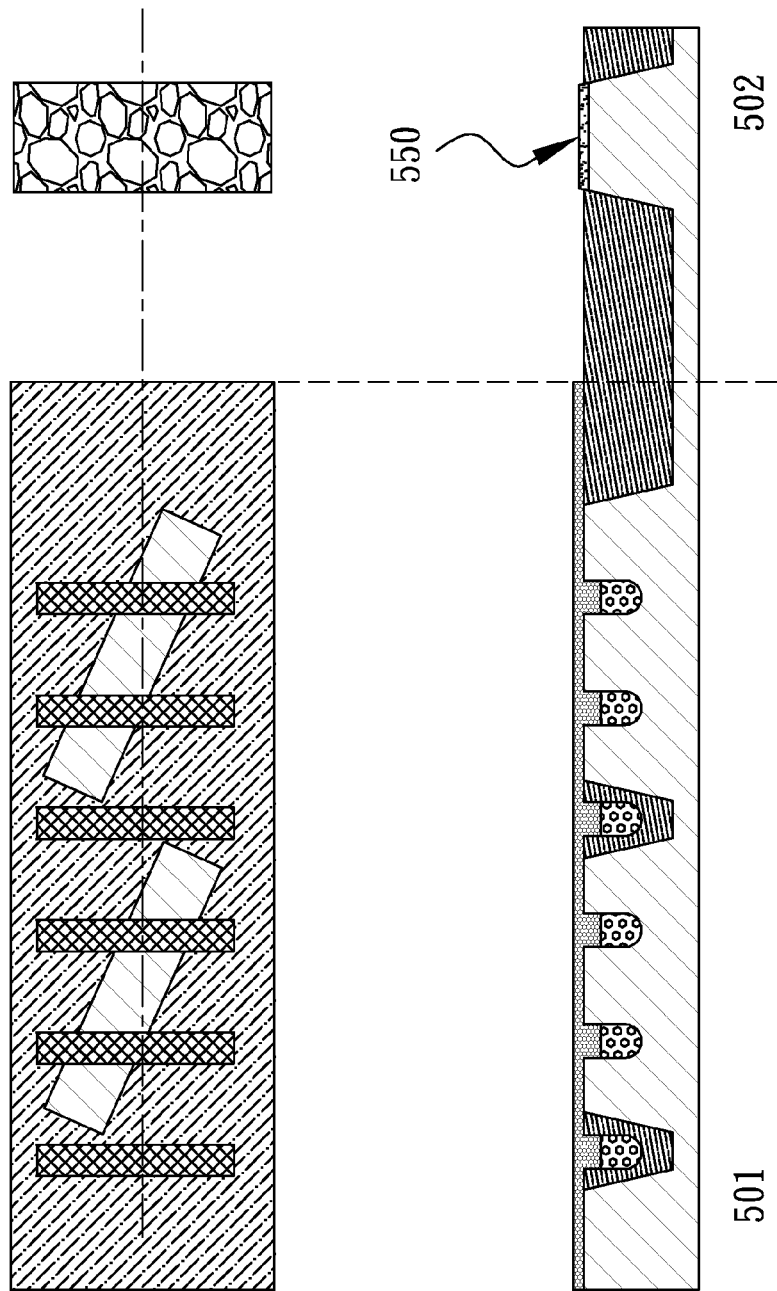
Figure 5H:
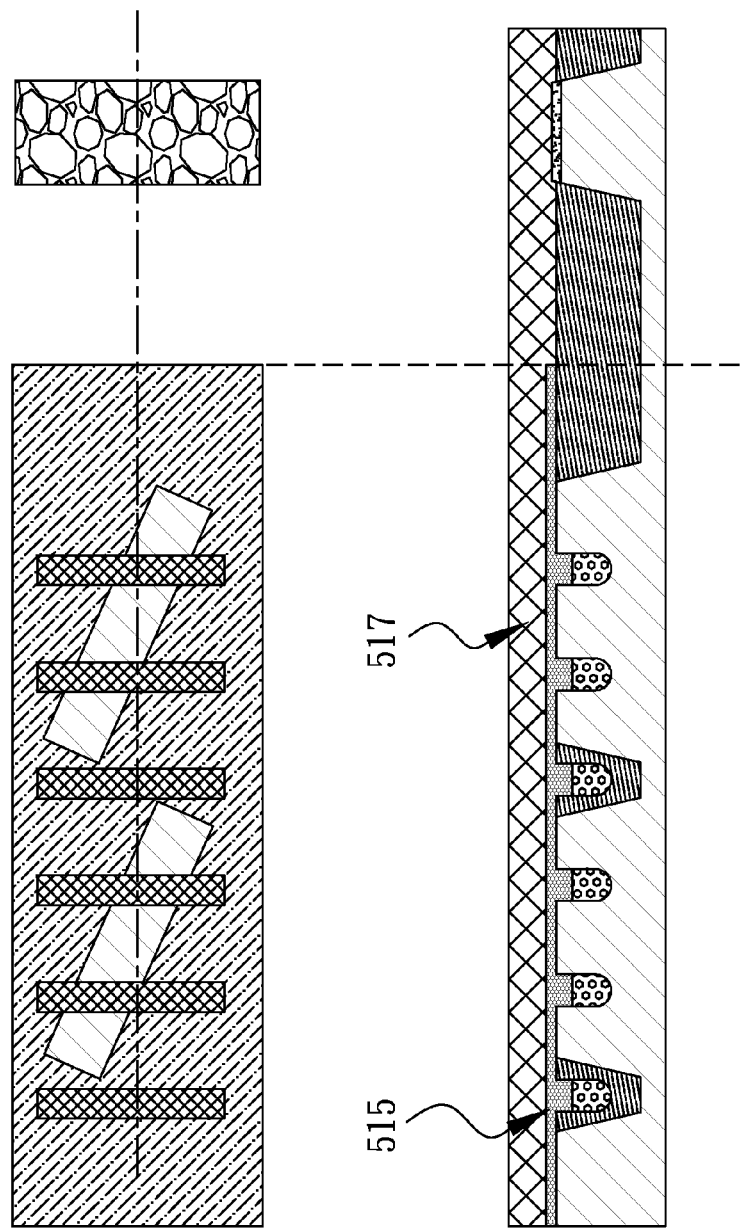
Figure 5I:
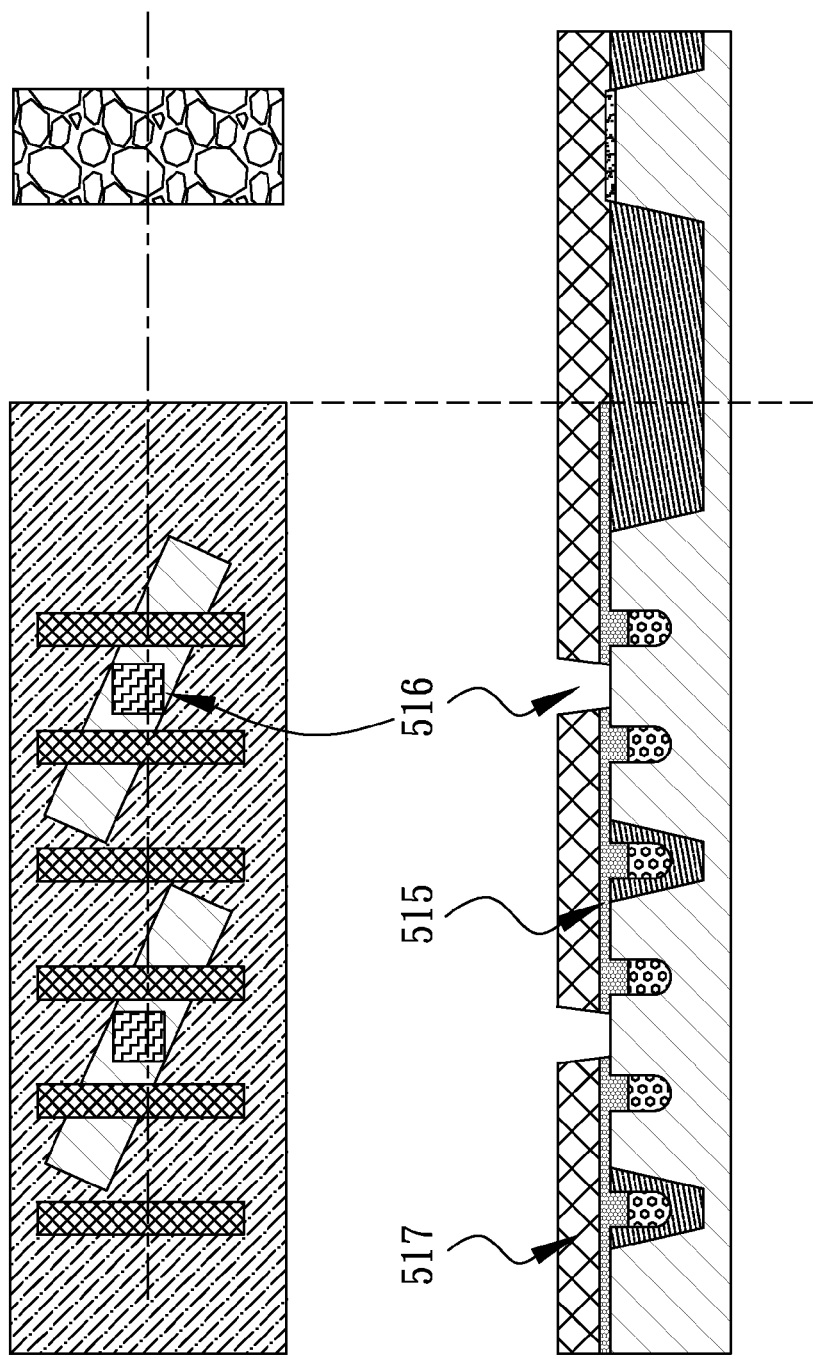

Next, in FIG. 5H, a polysilicon deposition process is performed to form a polysilicon layer 517 on the cap layer 515 formed in FIG. 5E. Next, in FIG. 5I, the bit line contact is patterned on the intended device surface by using a mask, and a bit line contact etching process is performed to form bit line contact holes 516 through the formed polysilicon layer 517 and cap layer 515. Next, in FIG. 5J, a metal stack deposition process is performed to form a better conducting (metal or metal-based) layer 518, such as a Ti layer, TiN layer, W layer, Ti/TiN/W layer, or any combination thereof, on the processed surface, including the etched polysilicon layer 517, in FIG. 5I. In particular, the metal or metal-based material is deposited into and fills the etched contact hole 516 formed in FIG. 5I, thereby forming the desired bit line contact plugs 516'. In one example, the metal or metal-based deposition layer 518 is selected to be a Ti/TiN/W layer.

Figure 5J:
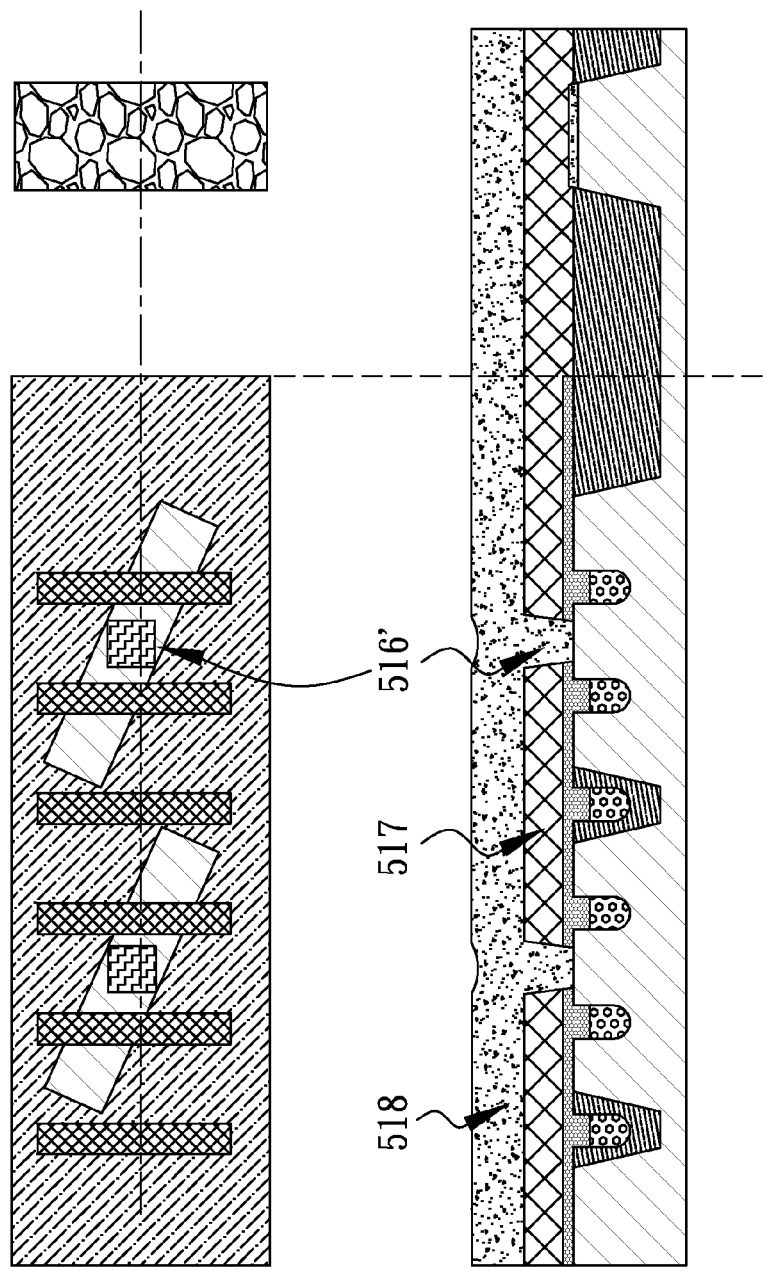
Figure 5K:
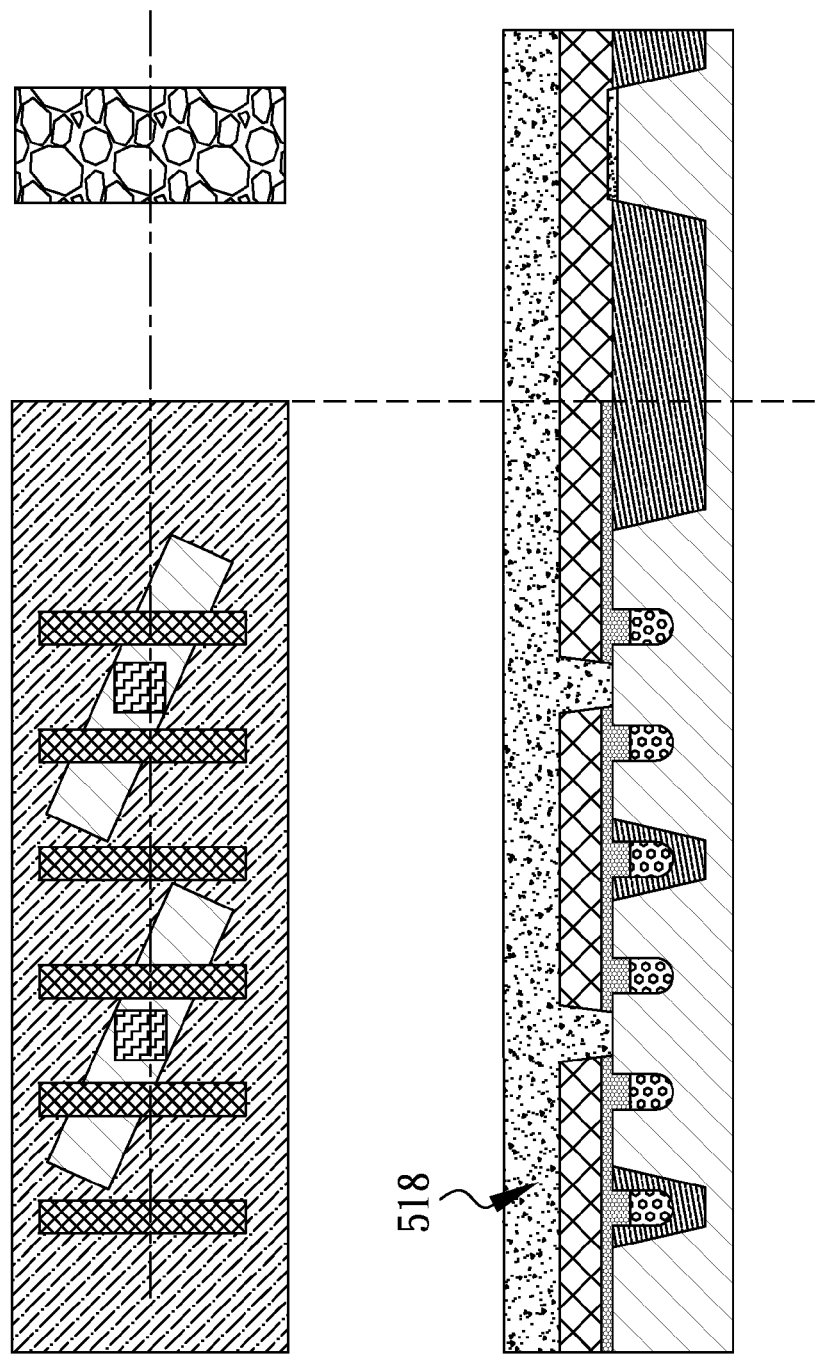
Figure 5L:
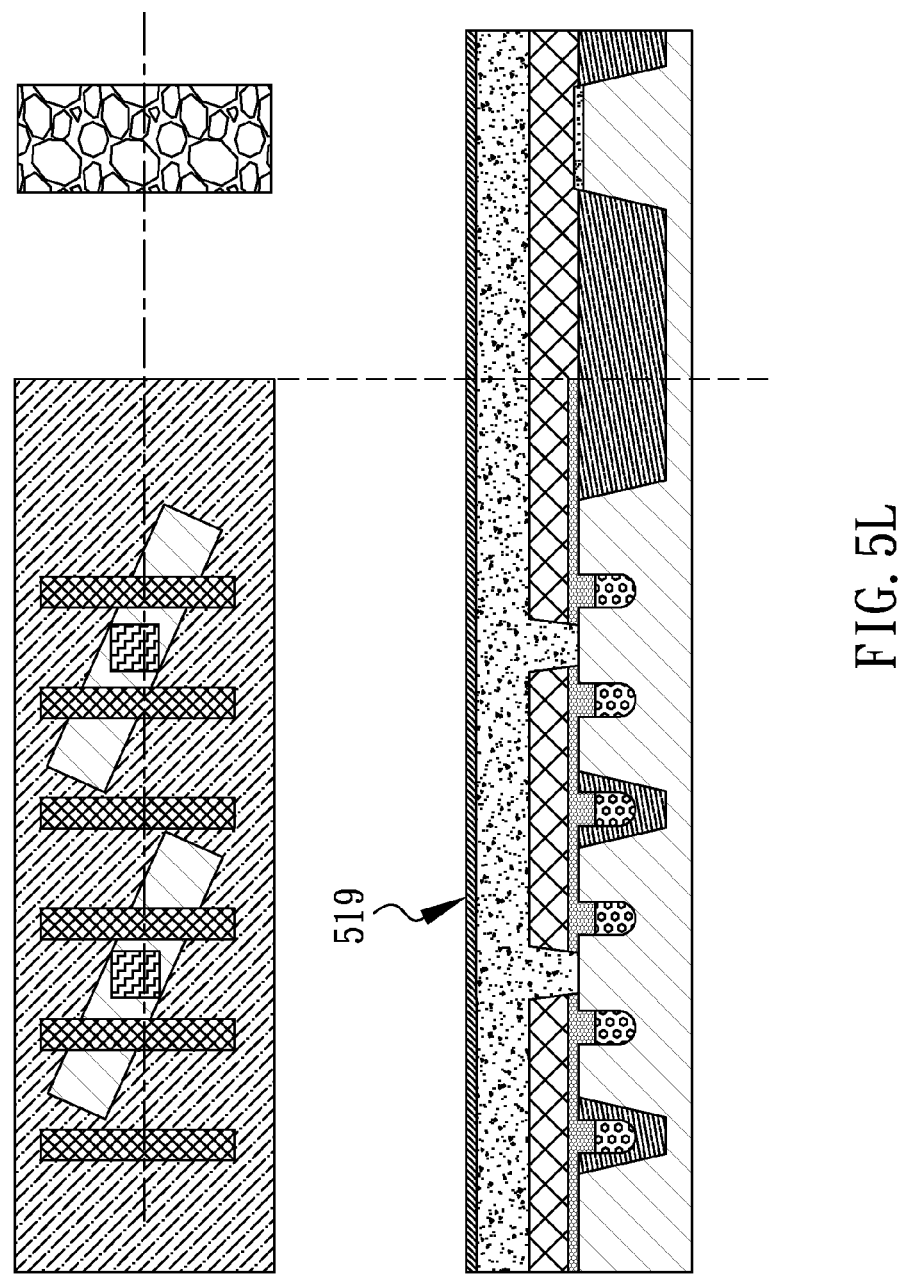

Next, in FIG. 5K, a chemical mechanical polishing (CMP) process is performed to planarize the surface of the metal or metal-based layer 518 formed in FIG. 5J. In one example, this step may be skipped. Next, in FIG. 5L, a hardmask layer deposition process is performed for achieving better resolution and profile control of the fabricated DRAM device 500. In one example, the formed hardmask layer 519 also can serve/function as an anti-reflective coating (ARC) layer on top of the metal or metal-based layer 518 polished in FIG. 5K. Finally in FIG. 5M, a bit line mask is applied to pattern the bit lines, and a bit line etching process is performed to form the needed bit lines 520. In one example, the bit line 520 comprises the polysilicon layer 517 and the metal or metal-based layer 518 as well.

Figure 5M:
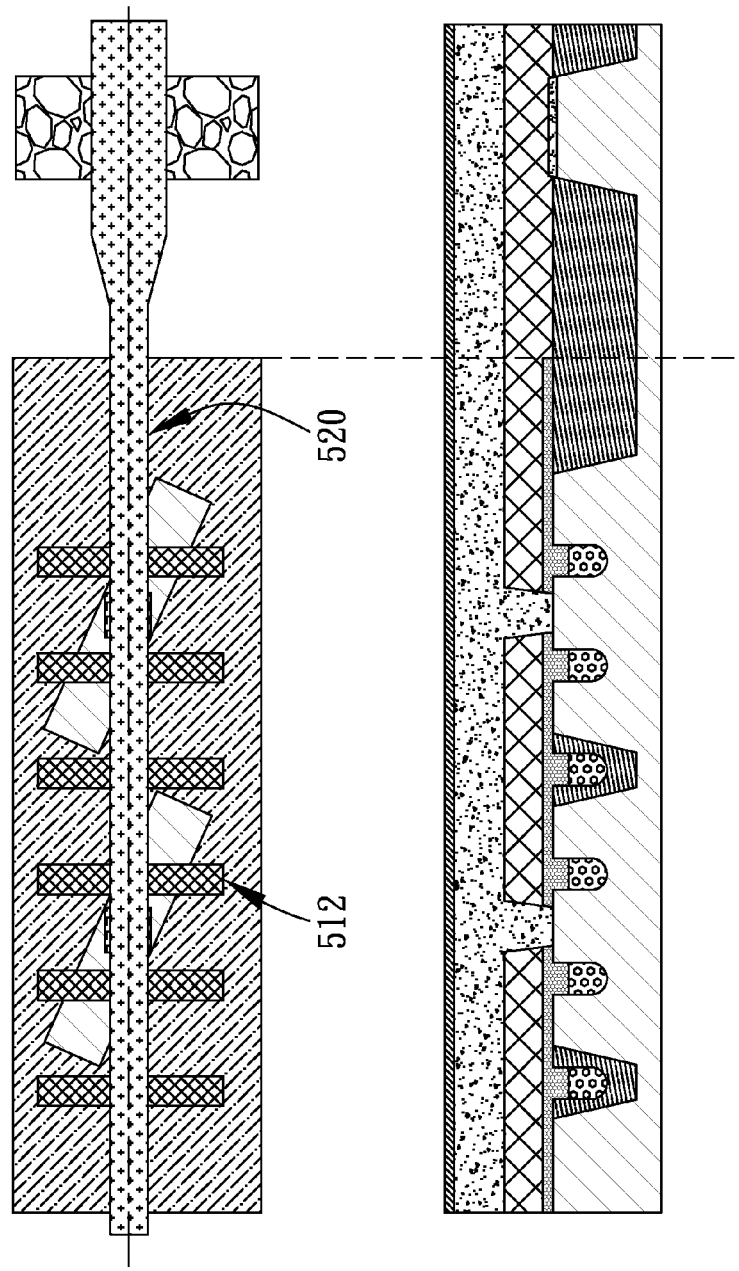

In FIG. 5M, it can be seen that in this embodiment, the formed bit line 520 is about perpendicular (e.g. perpendicular) to word line trench 512. As would be understood by those skilled in the art, in real practice this is not necessary i.e. the bit line may be at an angle to the word line trench wherein the angle is dependent upon the DRAM device layout specification. For example, the angle may be any degree ranging from about zero to ninety degrees depending on the device layout specification. Accordingly, the fabricated memory cell transistors may have an associated bit line (for example the polysilicon layer 517 and the Ti/TiN/W layer 518) and the word line (for example the remaining TiN/W layer 514 in the trench 512) at an angle other than ninety degrees.

Therefore, it is noted that not only the formation process but also the formed bit line contact plug of the present invention is different from that of the conventional art. The advantage(s) may include one or more of simpler process, less contact resistance (between the bit line contact and substrate), and avoidance of contamination of gate oxides of periphery transistors, etc.

In particular, it is noted that in the memory cell transistor 300 shown in FIG. 3, the bit line contact 116/116' is formed by etching the relatively thick polysilicon layer 117. This allows a much larger window for process control of the bit line contact formation, as compared to the existing buried word line processes in which the bit line contact is formed by etching the thin cap layer 115 (FIG. 2).

Although the present invention has been explained in relation to its preferred embodiment, it is to be understood that other modifications and variations can be made without departing from the spirit and scope of the invention as hereafter claimed.

What is claimed is:

1. A method for forming a memory cell transistor, comprising:
   providing a substrate;
   forming a trench structure in said substrate, said trench structure extends along a first direction;
   depositing a conductive substance on a surface of said substrate, wherein said conductive substance at least partially occupies an inner space of said trench structure thereby forming a conductive member inside said trench structure;
   forming one or more dielectric layers on the surface of said substrate, said dielectric layers covering said trench structure and said conductive member therein;
   forming one or more first conductive layers on top of said dielectric layers;
   etching said first conductive layers and said dielectric layers to form a hole structure; and
   forming one or more second conductive layers on top of said first conductive layers, wherein said second conductive layers are deposited into and fill said hole structure thereby forming a plug; performing chemical mechanical polishing process to planarize a surface of said second conductive layers;
   wherein said first conductive layers and said dielectric layers are etched before said second conductive layers are formed and after said first conductive layers are formed thereby said hole structure only extends through said first conductive layers and said dielectric layers, reaching to the surface of said substrate without extending through said second conductive layers, and said first and second conductive layers function as a bit line structure for said memory cell transistor thereby said hole structure does not extend through said bit line structure completely.

2. The method of claim 1, wherein said dielectric layers and said first conductive layers extending along a second direction which is at an angle to said first direction, said angle being from about zero to ninety degrees.

3. The method of claim 2, wherein said first and second directions are about perpendicular to each other.

4. The method of claim 1, wherein said conductive member functions as a gate electrode of said memory cell transistor and a word line structure for said memory cell transistor.

5. The method of claim 1, wherein said plug functions as a bit line contact plug for said memory cell transistor.

6. The method of claim 1, wherein said memory cell transistor comprises a dynamic random access memory (DRAM) cell transistor.

7. The method of claim 1, wherein depositing said conductive substance comprises forming a layer of said conductive substance on the surface of said substrate, and then selectively etching said layer of said conductive substance into said trench structure.

8. The method of claim 1, further comprising, prior to depositing said conductive substance, forming an oxide layer on the inner surface of said trench structure, wherein said oxide layer functions as a gate dielectric for said memory cell transistor.

9. The method of claim 1, wherein said conductive substance comprises titanium nitride, tungsten, or any combination thereof.

10. The method of claim 1, wherein said one or more dielectric layers are formed from substance comprising silicon nitride, silicon oxide, silicon oxynitride, or any combination thereof.

11. The method of claim 1, wherein said one or more first conductive layers are formed from substance comprising polysilicon.

12. The method of claim 1, wherein said one or more second conductive layers are formed from a substance comprising titanium, titanium nitride, tungsten, or any combination thereof.

13. A method for forming a memory cell transistor, comprising:
   providing a substrate;
   forming a trench structure in said substrate, said trench structure extends along a first direction;
   depositing a conductive substance on a surface of said substrate, wherein said conductive substance at least partially occupies an inner space of said trench structure thereby forming a conductive member inside said trench structure and said conductive member functions as a gate electrode of said memory cell transistor and a buried word line associated with said memory cell transistor;
   forming one or more dielectric layers on the surface of said substrate, said dielectric layers covering said trench structure and said conductive member therein;
   forming one or more first conductive layers on top of said dielectric layers; and
   etching said first conductive layers and said dielectric layers to form a hole structure; and forming one or more second conductive layers on top of said first conductive layers, wherein said second conductive layers are deposited into and fill said hole structure thereby forming a plug; performing chemical mechanical polishing process to planarize a surface of said second conductive layers;
   wherein said first conductive layers and said dielectric layers are etched before said second conductive layers are formed and after said first conductive layers are formed thereby said hole structure only extends through said first conductive layers and said dielectric layers, reaching to the surface of said substrate without extending through said second conductive layers.

* * * * *